US012622323B2

(12) United States Patent
Takeya

(10) Patent No.: US 12,622,323 B2
(45) Date of Patent: May 5, 2026

(54) SEMICONDUCTOR LIGHT EMITTING ELEMENT CHIP INTEGRATED DEVICE AND MANUFACTURING METHOD THEREOF

(71) Applicant: ULDTEC CO., LTD., Miyagi (JP)

(72) Inventor: Motonobu Takeya, Miyagi (JP)

(73) Assignee: ULDTEC CO., LTD., Miyagi (JP)

( * ) Notice: Subject to any disclaimer, the term of this patent is extended or adjusted under 35 U.S.C. 154(b) by 743 days.

(21) Appl. No.: 17/922,228

(22) PCT Filed: Jun. 15, 2021

(86) PCT No.: PCT/JP2021/022602
§ 371 (c)(1),
(2) Date: Oct. 28, 2022

(87) PCT Pub. No.: WO2021/256447
PCT Pub. Date: Dec. 23, 2021

(65) Prior Publication Data
US 2023/0178531 A1 Jun. 8, 2023

(30) Foreign Application Priority Data

Jun. 20, 2020 (JP) ................................. 2020-106632
Nov. 24, 2020 (JP) ................................. 2020-194227

(51) Int. Cl.
*H01L 25/16* (2023.01)
*H10H 20/01* (2025.01)
(Continued)

(52) U.S. Cl.
CPC ......... *H01L 25/167* (2013.01); *H10H 20/832* (2025.01); *H10H 20/857* (2025.01); *H10H 20/0364* (2025.01)

(58) Field of Classification Search
CPC ....... H01L 21/0485; H01L 2224/95101; H01L 2224/95085; H01L 2224/95136;
(Continued)

(56) References Cited

U.S. PATENT DOCUMENTS

2002/0013008 A1 1/2002 Sanaka et al.
2007/0284598 A1 12/2007 Shakuda et al.
(Continued)

FOREIGN PATENT DOCUMENTS

JP H08137413 A 5/1996
JP 2001257218 A 9/2001
(Continued)

OTHER PUBLICATIONS

International Search Report from corresponding PCT application PCT/JP2021/022602, dated Sep. 7, 2021.
(Continued)

*Primary Examiner* — Mark W Tornow
*Assistant Examiner* — Priya M Rampersaud
(74) *Attorney, Agent, or Firm* — K&L Gates LLP

(57) ABSTRACT

A liquid-droplet-like ink containing a plurality of vertical semiconductor light emitting element chips 40, each of which has a p-side electrode and an n-side electrode on the upper surface and the lower surface and is configured such that one of the p-side electrode and the n-side electrode is more strongly attracted to a magnetic field than the other is supplied to a chip joining part 421 on a lower electrode 420 on a mounting substrate 400, the semiconductor light emitting element chips 40 in the ink are joined to the chip joining part by applying an external magnetic field such that one of the p-side electrode and the n-side electrode faces to the chip joining part, and thereafter an upper electrode 430 having an upper electrode main line part 431 and a plurality of upper electrode branch line parts 432 which are connected by a
(Continued)

thin film fuse 433 each other is formed as the upper layer of the semiconductor light emitting element chips 40 such that the other of the p-side electrode and the n-side electrode of the semiconductor light emitting element chip 40 and the upper electrode branch line part 432 are electrically connected each other.

20 Claims, 32 Drawing Sheets

(51) Int. Cl.
H10H 20/832        (2025.01)
H10H 20/857        (2025.01)

(58) Field of Classification Search
CPC .......... H01L 2224/95144; H01L 22/22; H01L 21/6835; H01L 2224/75655; H01L 2224/7598; H01L 23/345; H01L 24/80; H01L 24/83; H01L 24/97; H01L 21/67017; H01L 21/479; H01L 2224/03; H01L 2221/68363; H01L 2221/68368; H01L 2221/68381; H01L 2224/95133; H01L 2224/95145; H01L 25/167; H01L 25/0753; H01L 23/12; H01L 25/00; H01L 25/075; G09F 9/33; H10H 20/01; H10H 20/0364; H10H 20/832; H10H 20/857
See application file for complete search history.

(56)                References Cited

U.S. PATENT DOCUMENTS

| | | | |
|---|---|---|---|
| 2010/0170086 A1* | 7/2010 | Ramadan | H01L 21/6835 |
| | | | 29/740 |
| 2013/0168708 A1* | 7/2013 | Shibata | H01L 24/97 |
| | | | 257/88 |
| 2015/0187991 A1 | 7/2015 | McGroddy et al. | |
| 2016/0093600 A1 | 3/2016 | Bower et al. | |
| 2016/0128159 A1* | 5/2016 | Usami | H05B 33/14 |
| | | | 313/504 |
| 2017/0062393 A1* | 3/2017 | Kim | H01L 24/80 |
| 2022/0310883 A1 | 9/2022 | Takeya | |

FOREIGN PATENT DOCUMENTS

| | | | |
|---|---|---|---|
| JP | 2003216052 A | 7/2003 | |
| JP | 2005174979 A | 6/2005 | |
| JP | 2010087453 A | 4/2010 | |
| JP | 2012195406 A | 10/2012 | |
| JP | 2013004792 A | 1/2013 | |
| JP | 2016025205 A | 2/2016 | |
| JP | 2017500757 A | 1/2017 | |
| JP | 2017531915 A | 10/2017 | |
| JP | 2018170339 A | 11/2018 | |
| JP | 2020025064 A | 2/2020 | |
| JP | 6694222 B1 | 5/2020 | |
| WO | 2006025497 A1 | 3/2006 | |
| WO | 2012008253 A1 | 1/2012 | |
| WO | 2015015915 A1 | 2/2015 | |
| WO | 2021084783 A1 | 5/2021 | |

OTHER PUBLICATIONS

Office action issued in corresponding Japanese Patent Application No. 2020-194227, dated Mar. 5, 2021. (8 pages.).

* cited by examiner

DIAMETER OF HEMISPHERE

PIXEL DENSITY 458ppi

PIXEL DENSITY 1000ppi

<u>400</u>

<u>400</u>

MAGNETIC FIELD

MAGNETIC FIELD

Fig. 38
4 PIXELS
802
801
421
802
800
420
50
40
410
420
400
Fig. 39
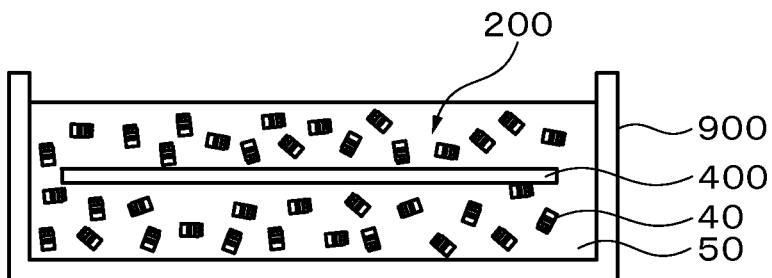
200
900
400
40
50
Fig. 40
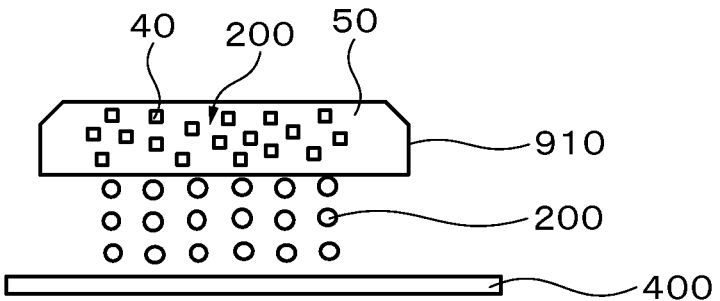
40   200   50
910
200
400

SEMICONDUCTOR LIGHT EMITTING ELEMENT CHIP INTEGRATED DEVICE AND MANUFACTURING METHOD THEREOF

TECHNICAL FIELD

The present invention relates to a semiconductor light emitting element chip integrated device and manufacturing method thereof which are suitably applied to, for example, a micro LED display in which a number of small-sized longitudinal (or vertical) micro light emitting diode (LED) chips are integrated on a substrate.

BACKGROUND ART

At present, the mainstream of displays such as thin type televisions, smartphones and the like are liquid crystal displays (LCDs) and organic EL displays (OLEDs). Regarding LCDs, the output light quantity is about a tenth of the light quantity of the backlight as pixels become small. Regarding OLEDs, although theoretical power efficiency is high, the output light quantity of real products remains in level equal to LCDs.

Micro LED displays receive attention as displays having high luminance and high efficiency (low power consumption) far surpassing LCDs and OLEDs. Direct light emission micro LED displays have high efficiency. However, in order to realize micro LED displays, it is necessary to arrange several tens million micro LED chips having the size of order of several μm to tens of μm.

As methods for arranging such a large number of micro LED chips on a mounting substrate, proposed conventionally have been a method using a chip sorter, a method using a multichip transfer device (see patent literatures 1 and 2), a chip arranging method using chip ejection by laser irradiation and a liquid (see patent literature 3), a device (chip) arranging method using a magnetic film (see patent literatures 4 and 5) and the like.

However, according to the methods proposed in the patent literatures 1-5, it has been difficult to realize micro LED displays at small cost.

Against the background described above, present inventor has proposed a method of manufacturing a semiconductor chip integrated device which can realize the micro LED display at small cost (see patent literature 6). According to the patent literature 6, the micro LED display is manufactured by ejecting an ink in which micro LED chips, each of which is configured such that the p-side electrode side is more strongly attracted to a magnetic field than the n-side electrode side, for example, are dispersed in a liquid to a chip joining part on one major surface of a substrate and joining the p-side electrode side of the micro LED chips to the chip joining part by applying an external magnetic field to the substrate from below it.

PRIOR ART LITERATURE

Patent Literature

[PATENT LITERATURE 1] Laid-open publication No. 2017-531915
[PATENT LITERATURE 2] Laid-open publication No. 2017-500757
[PATENT LITERATURE 3] Laid-open publication No. 2005-174979

[PATENT LITERATURE 4] Laid-open publication No. 2003-216052
[PATENT LITERATURE 5] Laid-open publication No. 2016-25205
[PATENT LITERATURE 6] Patent Gazette No. 6694222

SUMMARY OF INVENTION

Subjects to be Solved by Invention

According to the method of manufacturing a micro LED display described in the patent literature 6, it is possible to realize micro LED displays at small cost. However, when defection of micro LED chips is found by a test, it is not always easy to repair the micro LED display. Therefore, there is still room for improvement.

Therefore, the subject to be solved by the invention is to provide a semiconductor light emitting element chip integrated device and a manufacturing method thereof which can manufacture various semiconductor light emitting element chip integrated devices such as micro LED displays and the like, and which can easily repair the semiconductor light emitting element chip integrated device when defection of semiconductor light emitting element chips such as micro LED chips and the like is found by a test after the semiconductor light emitting element chips are mounted on a substrate.

Means to Solve the Subjects

In order to solve the object, according to the invention, there is provided a method of manufacturing a semiconductor light emitting element chip integrated device, comprising steps of:

supplying a liquid-droplet-like ink containing a liquid and a plurality of vertical semiconductor light emitting element chips, each of which has a p-side electrode and an n-side electrode on the upper surface and the lower surface and is configured such that one of the p-side electrode and the n-side electrode is more strongly attracted to a magnetic field than the other of the p-side electrode and the n-side electrode to a chip joining part formed by a part of the upper surface or a protrusion or a concavity formed on a part of the upper surface of a lower electrode on a substrate having the lower electrode on one major surface, to which semiconductor light emitting element chips are to be joined, joining the semiconductor light emitting element chips to the chip joining part by applying an external magnetic field from the opposite side with respect to the substrate such that the one of the p-side electrode and the n-side electrode faces the chip joining part and electrically connecting the one of the p-side electrode and the n-side electrode and the lower electrode; and forming an upper electrode as the upper layer of the semiconductor light emitting element chips having a main line part and a plurality of branch line parts which are electrically connected each other by a thin film fuse such that the other of the p-side electrode and the n-side electrode of at least one semiconductor light emitting element chip and the branch line part of the upper electrode are electrically connected each other.

The method of manufacturing a semiconductor light emitting element chip integrated device typically comprises further a step of testing the semiconductor light emitting element chip after the upper electrode is formed and cutting the thin film fuse between the branch line part to which a defective semiconductor light emitting element chip is connected and the main line part. If no defective semiconductor light emitting element chip is found by the test of the semiconductor light emitting element chip, it is not necessary to cut the thin film fuse.

The liquid contained in the ink containing semiconductor light emitting element chips is not particularly limited as far as semiconductor light emitting element chips to be used can be dispersed, and may be polar solvent or nonpolar solvent and selected as necessary. Polar solvent may be polar nonprotonic solvent and protonic solvent. The liquid may be water or nonaqueous solvent (a mixture of two or more kinds of solvents other than water and a mixture of water and two or more kinds of solvents other than water are included) and nonaqueous solvent may be nonactive solvent or active solvent.

The ink containing semiconductor light emitting element chips may contain Zener diodes and/or a plurality of low melting point metal particles as necessary. The Zener diode has a pn junction made of a p-type layer and an n-type layer and has a p-side electrode and an n-side electrode on the upper surface and the lower surface and is configured such that one of the p-side electrode and the n-side electrode is more strongly attracted to a magnetic field than the other. If the ink contains Zener diodes, by connecting the Zener diodes between the lower electrode and the upper electrode such that reverse bias is applied to the Zener diodes, when a surge voltage and the like is applied between the lower electrode and the upper electrode for some reason, current can pass through the Zener diodes. Therefore, it is possible to prevent electrostatic damage (ESD) of the semiconductor light emitting element chips. Typically, the Zener diodes are added in a ratio not larger than a tenth of the semiconductor light emitting element chips. Semiconductor light emitting element chips, each of which has a p-side electrode and an n-side electrode on the upper surface and the lower surface may be used instead of Zener diodes. In this case, one side of the p-side electrode and the n-side electrode of the semiconductor light emitting element chip which is more strongly attracted to a magnetic field than the other is changed so that reverse bias is applied against semiconductor light emitting element chips for light emission. When the ink contains a plurality of low melting point metal particles, even though low melting point metal is not formed on the chip joining part before one of the p-side electrode and the n-side electrode of the semiconductor light emitting element chips is joined to the chip joining part, it is possible to attach not only the semiconductor light emitting element chips but also low melting point metal particles to the chip joining part when the ink is supplied to the chip joining part. Therefore, it is not necessary to form low melting point metal beforehand, which simplifies manufacturing steps. As necessary, the ink may contain other components in addition to the semiconductor light emitting element chips, furthermore the Zener diodes and/or the low melting point metal particles and the liquid. The other components are, for example, fillers, surfactants or ingredients of glue. Materials, shapes, sizes and the like of the fillers are not particularly limited as far as they can be dispersed in the liquid of the ink and selected as necessary. For example, materials of the fillers are various resins such as silicone resin and the like. Shapes of the fillers are a sphere, an ellipsoid and the like. Sizes of the fillers are selected depending on size of the semiconductor light emitting element chip and the like and the average diameter of the filler is about 1~10 μm. Ingredients of glue serves to support the semiconductor light emitting element chips on the chip joining part when the liquid of the ink is dried.

The concentration of the semiconductor light emitting element chips in the ink is selected as necessary. Typically, 10~10000 semiconductor light emitting element chips are dispersed in the volume of 100 picoliters of the liquid. The volume ratio of the semiconductor light emitting element chips in the ink is selected as necessary and is typically not larger than 30%. The viscosity of the ink is selected as necessary and is, for example, 0.001~100 Pa·s.

Methods for supplying the ink to the chip joining part of the substrate are not particularly limited and are selected as necessary. Morphology of the liquid-droplet-like ink supplied to the chip joining part changes depending on wettability of the ink for the chip joining part and may take various morphologies from ball-like liquid droplet with large curvature to a flat liquid droplet with small curvature. Typically, the ink is ejected from the tip of a nozzle to the chip joining part. Preferably, the ink is ejected from the tip of the nozzle to the chip joining part by an inkjet printing method. In this case, the quantity of the ink ejected is selected as necessary as far as it contains a plurality of semiconductor light emitting element chips per chip joining part (for example, 2~100, or more in some cases). The ink supplied to the chip joining part of the substrate is subjected to compulsory drying by heating and the like or natural drying to remove liquid component. The semiconductor light emitting element chips contained in the ink supplied is brought into contact with the chip joining part with one of the p-side electrode and the n-side electrode facing the chip joining part by a method which will be described later. According to the method, the liquid droplet contains a plurality of semiconductor light emitting element chips. Here the number of the semiconductor light emitting element chips is determined flexibly. Therefore, applicability of inkjet printing method and the like can be improved. Furthermore, as will be described later, by setting the area of the chip joining part larger than the area of the semiconductor light emitting element chip and giving considerable degree of freedom to joining position of the semiconductor light emitting element chips to the chip joining part, it is possible to eliminate complicated control of chip joining position. As a result, manufacturing processes can be greatly simplified. Although the chip joining part is a limited area which occupation ratio is small, semiconductor light emitting element chips stay in the area in which the ejected liquid droplet expands and are not scattered over the whole substrate. Therefore, the semiconductor light emitting element chips can join to the chip joining part efficiently.

After the liquid-droplet-like ink is supplied to the chip joining part, an external magnetic field is applied so that the semiconductor light emitting element chips in the ink are joined to the chip joining part with one of the p-side electrode and the n-side electrode facing the chip joining part. Electrical connection of one of the p-side electrode and the n-side electrode and the lower electrode can be carried out, for example, by forming low melting point metal (for example, solder, low melting point metal particles and the like) and heating the low melting point metal to melt after the semiconductor light emitting element chips are joined to the chip joining part with one of the p-side electrode and the n-side electrode facing the chip joining part. In this way, one of the p-side electrode and the n-side electrode of the semiconductor light emitting element chips and the lower electrode are electrically and mechanically connected each other.

One of the p-side electrode and the n-side electrode of the semiconductor light emitting element chip typically contains soft magnetic materials. The soft magnetic materials are materials having small coercive force and large permeability and are strongly magnetized under influence of a magnetic field and do not have a magnetic force when the magnetic field does not exist. The soft magnetic materials include, for example, nickel (Ni), iron (Fe), cobalt (Co), permalloy (Fe-78.5Ni alloy), supermalloy (Fe-79Ni-5Mo alloy) and the like, but not limited to these.

The semiconductor light emitting element may include a light emitting diode (LED), a laser diode (LD) (especially, vertical cavity surface light emitting laser (VCSEL), an organic EL device and the like. The semiconductor light emitting element may be an AlGaInN-based semiconductor light emitting element, an AlGaInP-based semiconductor light emitting element and the like, but not limited to these. The AlGaInN-based semiconductor light emitting element is used to obtain light emission of a wavelength band of bluepurple, blue to green (wavelength of 390 nm~550 nm). The AlGaInP-based semiconductor light emitting element is used to obtain light emission of a wavelength band of red (wavelength of 600 nm~650 nm). The AlGaInN-based semiconductor light emitting element and phosphors may be combined to obtain wavelength bands of blue, green and red.

Chip size of the semiconductor light emitting element chip is selected as necessary and is generally selected to be not larger than 20 $\mu$m×20 $\mu$m, typically not larger than 10 $\mu$m×10 $\mu$m, most typically not larger than 5 $\mu$m×5 $\mu$m and is generally selected to be not smaller than 0.1 $\mu$m (100 nm)×0.1 $\mu$m (100 nm) or 0.5 $\mu$m (500 nm)×0.5 $\mu$m (500 nm). The thickness of the semiconductor light emitting element chip is selected as necessary and is generally selected to be not larger than 10 $\mu$m, preferably 5 $\mu$m. The semiconductor light emitting element chip is desired to be one produced by carrying out crystal growth of semiconductor layers forming the semiconductor light emitting element on a substrate and separating the substrate from the semiconductor layers and the thickness of the semiconductor layers is desired to be not larger than 10 $\mu$m, for example. The semiconductor light emitting element chip has, preferably, rotation symmetry with respect to an axis vertical to the chip surface and its shape is, for example, a circle, a square, a hexagon, an octagon and the like. In this case, the shape of the semiconductor light emitting element chip is a cylinder, a square prism, a hexagonal prism, an octagonal prism and the like, but not limited to these. The semiconductor light emitting element chip may be a truncated cone (obtained by cutting the top portion of a cone), a truncated polygonal cone (obtained by cutting the top portion of a polygonal cone) and the like. Especially, if the semiconductor light emitting element chip has a cylinder shape, the semiconductor light emitting element chip has preferably a diameter not larger than 10 $\mu$m and a thickness not larger than 10 $\mu$m. The number of the p-side electrode and the n-side electrode of the semiconductor light emitting element chip is typically one, respectively and their sizes are equal to or smaller than the chip size, though one or both of the p-side electrode and the n-side electrode may be formed by a plurality of electrodes each having sizes smaller than the chip size.

The substrate (or mounting substrate) is not limited and may be, for example, a Si substrate, a glass substrate, a glass epoxy substrate, a resin film, a printed circuit board and the like. The substrate may be rigid or flexible and transparent or opaque and may be selected as necessary. Arranging patterns, sizes, planar shapes, intervals and the like of chip joining parts formed on the upper surface of the lower electrode formed on one major surface of the substrate are selected as necessary depending on uses of the semiconductor light emitting element chip integrated device, semiconductor light emitting element chips to be mounted and the like. In an example of arranging pattern of chip joining parts of the substrate, the chip joining parts are formed in a two-dimensional array. In this case, a plurality of semiconductor light emitting element chips are joined to the respective chip joining parts formed in a two-dimensional array. The lower electrode serves as a wiring line for connecting the semiconductor light emitting element chips joined to the chip joining parts. The lower electrodes are formed in a desired pattern, arrangement and intervals. Size and the planar shape of the chip joining part are selected properly depending on the size and the planar shape of the semiconductor light emitting element chip to be mounted so that the semiconductor light emitting element chips are joined to the chip joining part. Intervals, numbers and the like of the chip joining parts are selected properly depending on functions demanded for the semiconductor light emitting element chip integrated device. Assuming that S denotes the area of the chip joining part and s denotes the area of the semiconductor light emitting element chip, 10 s≤S≤1000 s generally holds. Here, it is necessary to obtain the area where the semiconductor light emitting device chips can be joined to some extent for extent of the ink. As a result, 10 s≤S is adopted. On the other hand, if S is too much large, it may be an obstacle to device design such as wiring and the like. Therefore, S≤1000 s is appropriate.

The upper electrode formed as the upper layer of the semiconductor light emitting element chips has a plurality of branch line parts so as to straddle the chip joining part, preferably to extend over almost all the area of the chip joining part. The branch line parts may typically cover more than 80% of the area of the chip joining part. The width of each branch line part is 5~100 $\mu$m, the width of an opening between the branch line parts is 1~5 $\mu$m and the number of the branch line parts is 3~10. These numerals can be designed suitably depending on sizes of a circuit unit or a pixel containing the semiconductor light emitting element chips joined to the chip joining part, the area or shape of the chip joining part, chip size and the like. Typically, the branch line parts are formed parallel to each other and the branch line parts may be formed perpendicular to the main line part, but not limited to this. Each of the branch line parts may be generally electrically connected to the other of the p-side electrode and the n-side electrode of at least one, typically more than two of the semiconductor light emitting element chips joined to the chip joining part. Regarding the branch line parts, there may be a case where the branch line parts include branch line parts which are not electrically connected to the other of the p-side electrode and the n-side electrode of every semiconductor light emitting element chip. The main line part is typically formed to extend along the chip joining parts.

Materials, width, thickness and the like of the thin film fuse which connects the main line part and the branch line parts are selected such that the thin film fuse melts to be cut by applying a voltage and supplying a predetermined current between the branch line parts of the upper electrode which are connected to the other of the p-side electrode and the n-side electrode of the semiconductor light emitting element chip which is determined to be defective by the test and the lower electrode. The minimum value of the cross sectional area (width×thickness) is desired to be not larger than 0.5 $\mu$m$^2$, but not limited to this. The thin film fuse is made of metal having typically melting point not higher than 350° C.

and typically melting point not lower than 150° C. Exemplified as such metal are simple metal such as In, Sn and the like and alloy (eutectic alloy) such as InSn, InSnAg, AgSn, AgSn and the like, but not limited to this.

The lower electrode may also be formed to have a main line part and a plurality of branch line parts which are electrically connected by a thin film fuse similar to the upper electrode as necessary.

Typically, the substrate has a plurality of circuit units which can be independently driven and the lower electrode and the upper electrode are formed for each of the circuit units. The circuit unit is controlled by constant current drive by pulse width modulation (PWM) and the like. Therefore, if the emission efficiency of the semiconductor light emitting element chip is assumed to be constant for the current density, the same light quantity is obtained for the constant current value even though there occurs variation of the number of the semiconductor light emitting element chips which are connected to the circuit. Actual semiconductor light emitting element chip such as an AlGaInN-based semiconductor light emitting element chip is subject to variation of the emission efficiency due to current density under the influence of crystal defects, threading dislocation Auge recombination and the like. However, it is possible to design variation of the number of the semiconductor light emitting element chips and the current value of the circuit suitably so as to drive the semiconductor light emitting element chip within the range of the current density which does not cause abrupt variation of the emission efficiency.

Especially, if the semiconductor light emitting element chip integrated device is a color display, one pixel is typically formed by an area including more than 3 circuit units adjacent to each other. The area of one pixel is typically selected to be about 500 μm×500 μm, but may be larger or smaller than 500 μm×500 μm. In this case, emission of three colors of red, green and blue is made possible by more than 3 circuit units. Even when there exists difference in emission efficiency, wavelength and the like, a plurality of semiconductor light emitting element chips exist in one circuit unit and therefore emission efficiency, wavelength and the like are averaged in the circuit unit, so that difference in characteristics among circuit units of similar kinds can be reduced. Semiconductor light emitting element chips having particular difference of efficiency and wavelength do not concentrate in particular area and difference in characteristics among circuit units of similar kinds can be reduced, which are merits obtained by supplying a plurality of ultrafine semiconductor light emitting element chips in a form of ink and connecting a plurality of semiconductor light emitting element chips in most of the circuit units. Of course, in some cases, it may be necessary to minimize unevenness of color and the like which are caused by variation of efficiency and light quantity which are different for various circuit units of red, green and blue by control by circuit. However, the light quantity and the wavelength are averaged among circuit units of similar kinds. Therefore, complication of control such that fine adjustment such as white balance and the like for each pixel decreases, which contributes to lower the price of the product.

The area of the branch line part of the upper electrode or the branch line part of the lower electrode is typically selected to be not smaller than 10 times of the area of the other or the one of the p-side electrode and the n-side electrode. With this, it is surely possible to connect the branch line part of the upper electrode or the branch line part of the lower electrode and the other or the one of the p-side electrode and the n-side electrode of the semiconductor light emitting element chip. The area of the branch line part of the upper electrode or the branch line part of the lower electrode is typically selected to be not larger than 30% of the area of the circuit unit.

As necessary, the chip joining part is formed such that hydrophilic property or lipophilic property of the chip joining part is higher than that of the peripheral part depending on whether the ink is hydrophilic or lipophilic. With this, in case of the hydrophilic ink, if hydrophilic property of the chip joining part is higher than that of the peripheral part, when the ink is applied to the wide area including the chip joining part, or the ink is dropped such that the ink overlaps a part of the chip joining part, it is possible for the ink to concentrate on the chip joining part having higher hydrophilic property. Similarly, in case of the lipophilic ink, if lipophilic property of the chip joining part is higher than that of the peripheral part, when the ink is applied to the wide area including the chip joining part, or the ink is applied such that the ink overlaps a part of the chip joining part, it is possible for the ink to concentrate on the chip joining part having higher lipophilic property. As necessary, a predetermined group of the chip joining parts which are adjacent to each other may be mutually connected by an area which is formed to have the high hydrophilic property or lipophilic property similar to the chip joining parts. With this, even when the ink is dropped to only a part of the predetermined group of the chip joining parts which are adjacent to each other, the dropped ink can spread over the entire of the predetermined group of the chip joining parts via the connection path. As a result, even if the size of the chip joining part is small, it is not necessary to decrease the quantity of the dropped ink excessively. And the degree of difficulty of manufacturing of nozzles is not made high and choking of nozzle can be avoided. Therefore, it is possible to drop the ink without a hitch. The minimum quantity of the liquid-droplet which is ejected from the standard inkjet nozzle is about 10 picolitters. The liquid-droplet spreads over an area of about 50 μm. Regarding the ultrafine pixel such as 1000 ppi, the pixel size is about 25 μm and the subpixel size is more than about 8 μm. It is not easy to stay one liquid-droplet dropped in such a fine area. This method is effective especially when the ultrafine pixel which has the width of the subpixel in a pixel of not larger than 50 μm is formed.

The semiconductor light emitting element chip integrated device may be any and is suitably designed depending on kinds of semiconductor light emitting element chips. The semiconductor light emitting element chip integrated device may be a device in which a kind of semiconductor light emitting element chip is integrated, a device in which more than two kinds of semiconductor light emitting element chips are integrated or such a device combined with phosphors. The semiconductor light emitting element chip integrated device is, for example, a light emitting diode illumination device, a light emitting diode backlight, a light emitting diode display and the like, but not limited to these. Size, planar shape and the like of the semiconductor light emitting element chip integrated device are suitably selected depending on uses of the semiconductor light emitting element chip integrated device, functions demanded for the semiconductor light emitting element chip integrated device and the like.

According to the invention, there is provided a semiconductor light emitting element chip integrated device, comprising:

a substrate having a lower electrode on one major surface, a chip joining part on which semiconductor light emitting element chips are to be joined which is formed by a part of the upper surface or a protrusion or a concavity formed on a part of the upper surface of a lower electrode, a plurality of vertical semiconductor light emitting element chips joined to the chip joining part, each of which has a p-side electrode and an n-side electrode on the upper surface and the lower surface and is configured such that one of the p-side electrode and the n-side electrode is more strongly attracted to a magnetic field than the other; and an upper electrode as the upper layer of the semiconductor light emitting element chips having a main line part and a plurality of branch line parts which are connected each other by a thin film fuse, the semiconductor light emitting element chips being joined to the chip joining part such that the one of the p-side electrode and the n-side electrode faces the chip joining part, the one of the p-side electrode and the n-side electrode and the lower electrode being electrically connected each other, and the other of the p-side electrode and the n-side electrode of at least one semiconductor light emitting element chip and the branch line parts of the upper electrode being electrically connected each other.

In the invention of the semiconductor light emitting element chip integrated device, the explanation concerning the above invention of the method of manufacturing a semiconductor light emitting element chip integrated device comes into effect unless it is contrary to its character.

According to the invention, there is provided a method of manufacturing a semiconductor light emitting element chip integrated device, comprising steps of:

supplying a liquid-droplet-like ink containing a liquid and a plurality of vertical semiconductor light emitting element chips, each of which has a p-side electrode and an n-side electrode on the upper surface and the lower surface and is configured such that one of the p-side electrode and the n-side electrode is more strongly attracted to a magnetic field than the other of the p-side electrode and the n-side electrode to a chip joining part formed by the upper surface of branch line parts of a lower electrode on a substrate having a main line part and a plurality of branch line parts which are electrically connected each other by a thin film fuse on one major surface, to which semiconductor light emitting element chips are to be joined, joining the semiconductor light emitting element chips in the ink to the chip joining part by applying an external magnetic field from the opposite side with respect to the substrate such that the one of the p-side electrode and the n-side electrode faces the chip joining part and electrically connecting the one of the p-side electrode and the n-side electrode and the branch line parts of the lower electrode; and forming an upper electrode as the upper layer of the semiconductor light emitting element chips such that the other of the p-side electrode and the n-side electrode of at least one semiconductor light emitting element chip and the upper electrode are electrically connected each other.

The method of manufacturing a semiconductor light emitting element chip integrated device is different from the method of manufacturing a semiconductor light emitting element chip integrated device described above in that the lower electrode, not the upper electrode, is formed such that it has a main line part and a plurality of branch line parts which are connected each other by a thin film fuse. As necessary, similar to the lower electrode, the upper electrode may also be formed such that it has a main line part and a plurality of branch line parts which are connected each other by a thin film fuse. In the invention of the method of manufacturing a semiconductor light emitting element chip integrated device, the explanation concerning the above invention of the method of manufacturing a semiconductor light emitting element chip integrated device comes into effect unless it is contrary to its character.

According to the invention, there is provided a semiconductor light emitting element chip integrated device, comprising:

a substrate having a lower electrode having a main line part and a plurality of branch line parts which are connected each other by a thin film fuse on one major surface, a chip joining part which is formed by the upper surface of the branch line part of the lower electrode, to which semiconductor light emitting element chips are to be joined, a plurality of vertical semiconductor light emitting element chips joined to the chip joining part, each of which has a p-side electrode and an n-side electrode on the upper surface and the lower surface and is configured such that one of the p-side electrode and the n-side electrode is more strongly attracted to a magnetic field than the other; and an upper electrode as the upper layer of the semiconductor light emitting element chips, the semiconductor light emitting element chips being joined to the chip joining part such that the one of the p-side electrode and the n-side electrode faces the chip joining part, the one of the p-side electrode and the n-side electrode and the branch line part of the lower electrode being electrically connected each other, and the other of the p-side electrode and the n-side electrode of at least one semiconductor light emitting element chip and the upper electrode being electrically connected each other.

In the invention of the semiconductor light emitting element chip integrated device, the explanation concerning the above invention of the method of manufacturing a semiconductor light emitting element chip integrated device comes into effect unless it is contrary to its character.

Effect of the Invention

According to the invention, it is possible to easily bring the semiconductor light emitting element chips into contact with the chip joining part of the substrate facing one of the p-side electrode and the n-side electrode to the chip joining part by supplying the ink containing the semiconductor light emitting element chips to the chip joining part of the substrate and by applying an external magnetic field from the side opposite to the chip joining part with respect to the substrate. And, for example, by forming low melting point metal on the chip joining part or one of the p-side electrode and the n-side electrode, bringing the semiconductor light emitting element chips into contact with the chip joining part facing one of the p-side electrode and the n-side electrode downward and by heating the low melting metal to make melt, it is possible to connect electrically and mechanically the semiconductor light emitting element chips and the chip joining part. And, for example, by forming the chip joining parts in a two-dimensional array, it is possible to easily realize a large-sized or large integration density semiconductor light emitting element chip integrated device, for example, a light emitting diode illumination device, a large-sized light emitting diode backlight, a large screen light emitting diode display and the like. Furthermore, when some of the semiconductor light emitting element chips connected to the upper electrode and the lower electrode are defective, it is possible to easily repair by cutting the thin film fuse between the main line part of the upper electrode or the lower electrode to which the defective semiconductor light emitting element chips are connected by electrifying to separate the branch line parts to which the defective semiconductor light emitting element chips are connected from the main line part, which can realize simplification of repair work and increase of the yield of the product. According to the method, for example, in the case of a light emitting diode display and the like, by decreasing extremely the size of the semiconductor light emitting element chip and arranging a plurality of semiconductor light emitting element chips in a pixel, even if defective semiconductor light emitting element chips are included in the pixel, apart of the branch line parts can be separated. Therefore, semiconductor light emitting element chips connected to the remaining branch line parts can be used. As a result, it is possible to reduce loss of materials (semiconductor light emitting element chips) and control increase of cost of materials caused by introduction of repair structure. Furthermore, ultrafine pixel can be easily realized. The invention can solve subjects of conventionally proposed manufacturing method using liquid-droplet and give a solution which can easily perform repairs which are indispensable for securing the yield of product, which can realize a great reduction of price of the fine semiconductor light emitting element chip integrated device such as a micro LED display and the like.

BRIEF DESCRIPTION OF THE DRAWINGS

FIG. 4 A schematic view showing an ink ejection device which is used in the method of manufacturing a micro LED integrated device according to the first embodiment of the invention.

FIG. 19 A plan view showing a mounting substrate of an active driving system color micro LED display according to a fifth embodiment of the invention.

FIG. 37A A plan view showing the method of manufacturing an ultrafine pixel color micro LED display according to the eighth embodiment of the invention.

FIG. 37B A cross-sectional view showing the method of manufacturing an ultrafine pixel color micro LED display according to the eighth embodiment of the invention.

FIG. 38 A plan view showing the method of manufacturing an ultrafine pixel color micro LED display according to the eighth embodiment of the invention.

FIG. 39 A schematic view showing a method of manufacturing an ultrafine pixel color micro LED display according to a ninth embodiment of the invention.

FIG. 40 A schematic view showing the method of manufacturing an ultrafine pixel color micro LED display according to the ninth embodiment of the invention.

MODES FOR CARRYING OUT THE INVENTION

Modes for carrying out the invention (hereinafter referred as embodiments) will now be explained below.

The First Embodiment

The micro LED integrated device according to the first embodiment is manufactured by mounting a number of vertical micro LED chips on a mounting substrate. Firstly, the vertical micro LED chip having a p-side electrode and an n-side electrode on the upper surface and the lower surface, an ink containing the vertical micro LED chips, and an ink ejection device which is used to eject the ink and the mounting substrate are described.

[Method of Manufacturing a Micro LED Integrated Device]

(1) Vertical Micro LED Chip

The vertical micro LED chip is configured such that the p-side electrode side is more strongly attracted to a magnetic field than the n-side electrode side.

Figure 1:
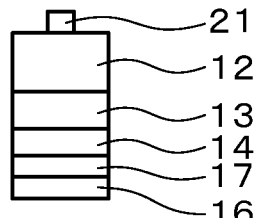
FIG. 1 A cross-sectional view showing a vertical micro LED chip which is used in a method of manufacturing a micro LED integrated device according to a first embodiment of the invention.

As shown in FIG. 1, the vertical micro LED chip 40 has an $n^+$-type GaN layer 12, a light emitting layer 13 and a p-type GaN layer 14 which are stacked each other. A p-side electrode 17 is provided on the p-type GaN layer 14, a Sn film 16 is provided on the p-side electrode 17 and an n-side electrode 21 is provided on the $n^+$-type GaN layer 12. The light emitting layer 13 has $In_xGa_{1-x}N/In_yGa_{1-y}N$ multiquantum well (MQW) structure (x<y, 0≤x<1, 0≤y<1) in which the $In_xGa_{1-x}N$ layer as the barrier layer and the $In_yGa_{1-y}M$ layer as the well layer are alternately stacked. The thickness of the $n^+$-type GaN layer 12 is, for example, 0.8~2.6 μm. The thickness of the light emitting layer 13 is, for example, 0.1~0.2 μm. The thickness of the p-type GaN layer 14 is, for example, 0.1~0.2 μm. The total thickness of the $n^+$-type GaN layer 12, the light emitting layer 13 and the p-type GaN layer 14 is, for example, 1~3 μm. The In compositions x, y of the $In_xGa_{1-x}N/In_yGa_{1-y}N$ MQW structure composing the light emitting layer 13 is determined depending on the emission wavelength of the vertical micro LED chip 40. The p-side electrode 17 is made of, for example, a multilayered film such as a Ti/Ni/Ti/Ni/Ti/Ni/Ti/Au film and the like. The thickness of each film forming the multilayered film is, for example, Ti film 0.01 μm, Ni film 0.2 μm, Ti film 0.1 μm, Ni film 0.2 μm, Ti film 0.1 μm, Ni film 0.2 μm, Ti film 0.1 μm, Au film 0.05 μm, in order from the bottom film. Ni films of the multilayerd film are soft magnetic materials. The n-side electrode 21 is made of, for example, a layered film such as an Al film and an Au film. The thickness of the Sn film 16 is, for example, 0.5 μm. The vertical micro LED chip 40 can be manufactured by conventionally publicly known method.

Figure 2A:
FIG. 2A A plan view showing an example of the planar shape of the vertical micro LED chip shown in FIG. 1.
Figure 2B:
FIG. 2B A plan view showing another example of the planar shape of the vertical micro LED chip shown in FIG. 1.
Figure 2C:
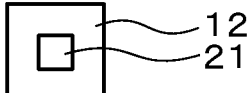
FIG. 2C A plan view showing still another example of the planar shape of the vertical micro LED chip shown in FIG. 1.

FIG. 2A, FIG. 2B and FIG. 2C show examples of the planar shape of the vertical micro LED chip 40. The vertical micro LED chip 40 may have rotation symmetry to some extent. FIG. 2A shows the case where the planar shape is a circle, FIG. 20B shows the case where the planar shape is a hexagon and FIG. 2C shows the case where the planar shape is a square and general shapes of the vertical micro LED chip 40 shown in FIG. 2A, FIG. 2B and FIG. 2C are a cylinder, a hexagonal prism and a square prism, respectively. The size of the vertical micro LED chip 40 is, for example, (0.1~10 μm)×(0.1~10 μm).

(2) Ink

Figure 3:
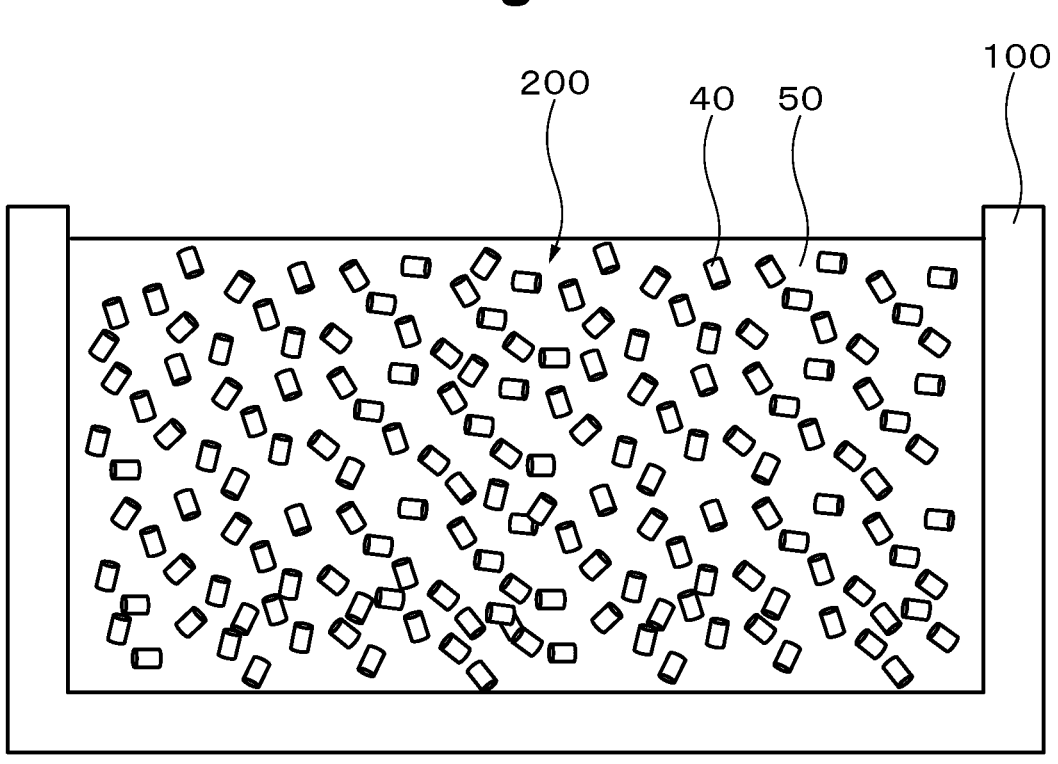
FIG. 3 A schematic view showing an ink which is used in the method of manufacturing a micro LED integrated device according to the first embodiment of the invention.

As shown in FIG. 3, an ink 200 is prepared by dispersing the vertical micro LED chips 40 in a liquid 50 in a container 100. As necessary, fillers, surfactants and the like may be contained in the ink 200 in addition to the vertical micro LED chips 40. If the size of the vertical micro LED chip 40 is (0.1~10 μm)×(0.1~10 μm) as mentioned above, the vertical micro LED chips 40 are dispersed sufficiently well in the ink 200. Therefore, it is possible to easily eject the ink 200 from an ejection nozzle of an ink ejection device.

(3) Ink Ejection Device

Figure 4:
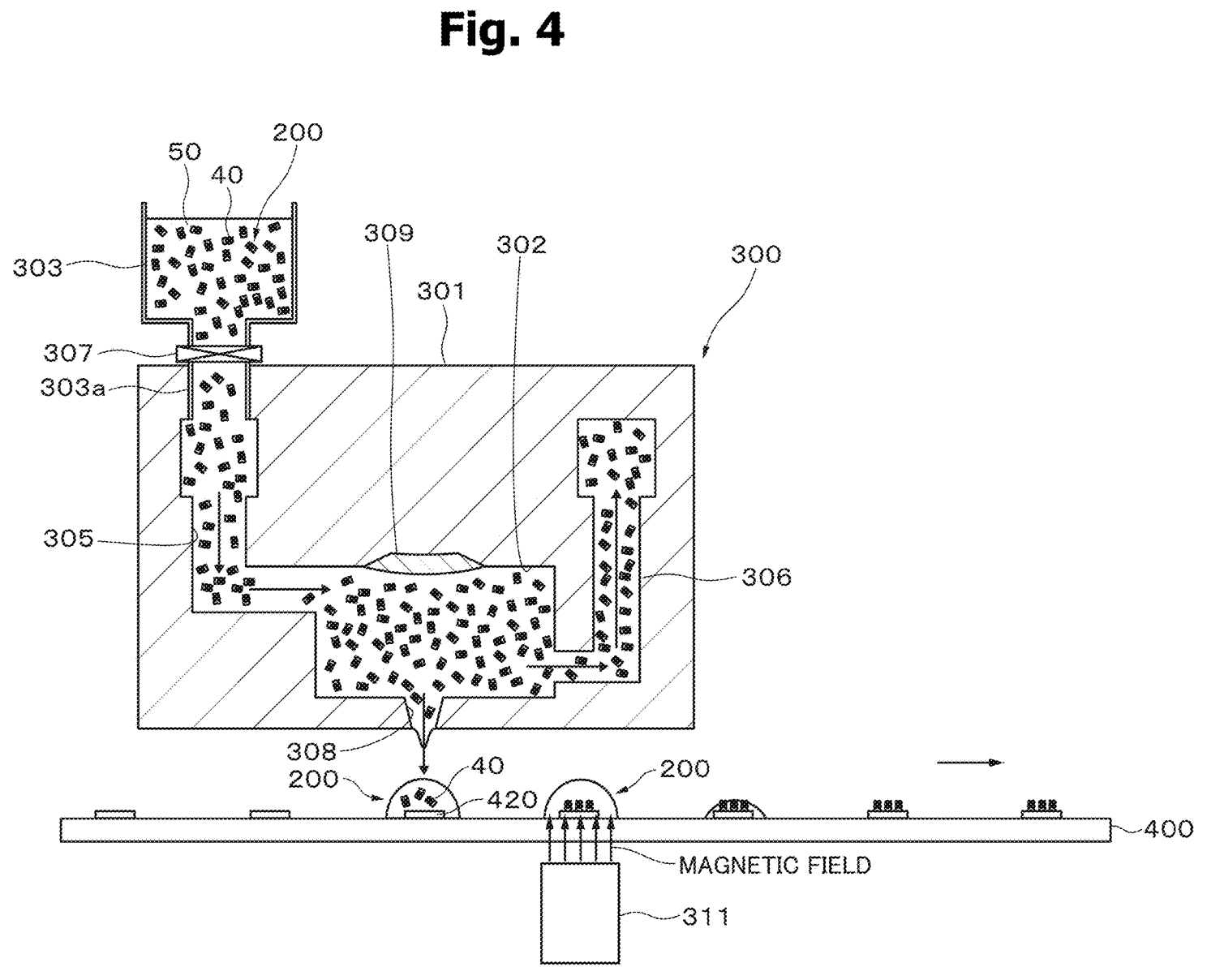

FIG. 4 shows an ink ejection device 300.

As shown in FIG. 4, the ink ejection device 300 has an inkjet print head 301. The inkjet print head 301 has an ink chamber 302 inside and has an ink supplying part 303 in the upper part. The inkjet print head 301 has inside also a flow path 305 which connects the side wall of the upper part of the ink chamber 302 and a tube part 303a provided on the base of the ink supplying part 303 and a flow path 306 which is connected to the side wall of the lower part of the ink chamber 302. A control valve 307 is provided in the midway of the tube part 303a of the ink supplying part 303. An ejection nozzle 308 is provided below the ink chamber 302. The diameter of the ejection nozzle 308 is selected as necessary and, for example, 10~50 μm. Provided on the ink chamber 302 is a piezoactuator 309 having the structure in which a piezoelectric body is sandwiched between a pair of electrodes. The flow path 306 serves to eject the ink 200 in the ink chamber 302 outside, or to prevent the ejection nozzle 308 from choking by returning the ink to the ink supplying part 303 and circulating, or to obtain stirring function of the ink 200.

In the ink ejection device 300, when the control valve 307 is open, the ink 200 is supplied to the ink supplying part 303. The ink 200 which is supplied to the ink supplying part 303 is supplied to the ink chamber 302 through the tube part 303a and the flow path 305. The ink 200 is supplied until the flow path 305, the ink chamber 302 and the flow path 306 are filled up and then the control value 307 is closed.

The ink ejection device 300 has also a magnetic field applying device 311 in a position slightly shifted in the horizontal direction from the ejection nozzle 308 of the ink ejection device 300. A mounting substrate 400 to which the ink 200 is ejected, which is described later, is moved in the horizontal direction in a position with the height between the inkjet print head 301 and the magnetic field applying device 311.

(4) Mounting Substrate

Figures 5A, 5B:
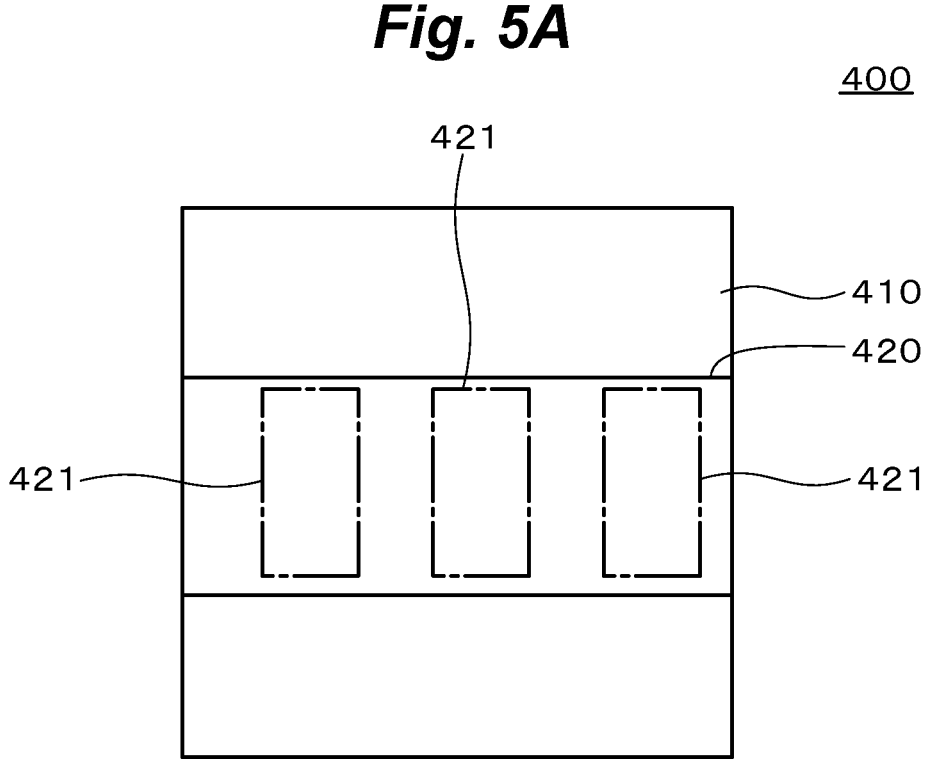
FIG. 5A A plan view showing a mounting substrate which is used in the method of manufacturing a micro LED integrated device according to the first embodiment of the invention.
FIG. 5B A cross-sectional view showing the mounting substrate which is used in the method of manufacturing a micro LED integrated device according to the first embodiment of the invention.
Figures 6A, 6B, 7:
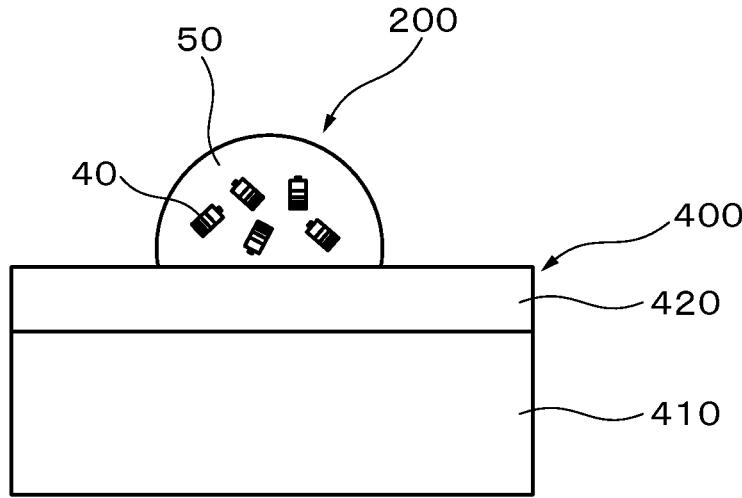
FIG. 6A A cross-sectional view showing an example of the chip joining part of the mounting substrate which is used in the method of manufacturing a micro LED integrated device according to the first embodiment of the invention.
FIG. 6B A cross-sectional view showing another example of the chip joining part of the mounting substrate which is used in the method of manufacturing a micro LED integrated device according to the first embodiment of the invention.
FIG. 7 A cross-sectional view showing the state where the ink is ejected to the chip joining part of the mounting substrate in the method of manufacturing a micro LED integrated device according to the first embodiment of the invention.

FIG. 5A and FIG. 5B show a mounting substrate 400 which is used to manufacture the micro LED integrated device. Here, FIG. 5B is a cross-sectional view along the lower electrode. As shown in FIG. 5A and FIG. 5B, a lower electrode 420 having a predetermined shape is formed on one major surface of a substrate 410. Actually, a number of lower electrodes 420 are provided, though only one of them is shown in FIG. 5A and FIG. 5B. The substrate 410 may be rigid or flexible and transparent or opaque and may be selected as necessary. The substrate 410 may be, for example, a Si substrate, a glass substrate, a glass epoxy substrate and the like, or resin film and the like. The lower electrode 420 can be formed, for example, by forming a nonmagnetic metal film on the whole surface of the substrate 410 by a sputtering method, a vacuum evaporation method and the like and patterning the metal film to have a predetermined shape by lithography and etching. The metal film is made of nonmagnetic metal, for example, a Ti/Al/Ti/Au/Ti layered film, but a Cu (or Cu alloy)/Au/Ti layered film can be also used. Thicknesses of films forming the Ti/Al/Ti/Au/Ti layered film are, for example, 5~10 nm, 300~1000 nm, 50 nm, 5~100 nm, 50 nm in order from the bottom film. Chip joining parts 421 are provided on the lower electrode 420. The chip joining part 421 is an area to which the vertical micro LED chips 40 are joined and at which one circuit unit is formed. Actually, a number of chip joining parts 421 are arranged in, for example, two-dimensional array, though only three of them are shown in FIG. 5A and FIG. 5B. If the upper surface of the lower electrode 420 is flat, the chip joining part 421 is an area of the part of the flat surface, which is shown in FIG. 5A by a dashed-and-dotted line. As shown in FIG. 6A, if a protrusion is provided in the part of the upper surface of the lower electrode 420 corresponding to the chip joining part 421, the chip joining part 421 is the upper surface of the protrusion. As shown in FIG. 6B, if a concavity is provided in the part of the upper surface of the lower electrode 420 corresponding to the chip joining part 421, the chip joining part 421 is the base of the concavity.

(5) Method of Manufacturing a Micro LED Integrated Device

Described is a method of manufacturing a micro LED integrated device based on the above description.

As shown in FIG. 4, the mounting substrate 400 is placed horizontally below the ejection nozzle 308 of the ink ejection device 300. In this case, the ink ejection device 300 is fixed and the mounting substrate 400 is moved by a transporting mechanism not illustrated in a direction shown by the arrow in FIG. 4 in the horizontal plane. The ink 200 is ejected to the chip joining part 421 of the mounting substrate 400 from the ejection nozzle 308 by operating the piezoactuator 309. As necessary, the ink 200 may be ejected to the chip joining part 421 a plurality of times. A droplet of the ink 200 formed in this way contains at least a plurality of the vertical micro LED chips 40. The number of the vertical micro LED chips 40 contained in a droplet of the ink 200 can be adjusted by the concentration of the vertical micro LED chips 40 in the ink 200, the number of times of ejection and the like. FIG. 7 shows the ink 200 in this state. In this case, the volume of a droplet of the ink 200 is, for example, 1~10 picoliters. The volume of the vertical micro LED chip 40 is generally 0.001~0.5 picoliters. For example, if the vertical micro LED chip 40 has a circular shape having a diameter of 10 μm and a thickness of 5 μm, its volume is about 0.4 picoliters. If the vertical micro LED chip 40 has a circular shape having a diameter of 1 μm and a thickness of 3 μm, its volume is about 0.0024 picoliters.

Figure 8:
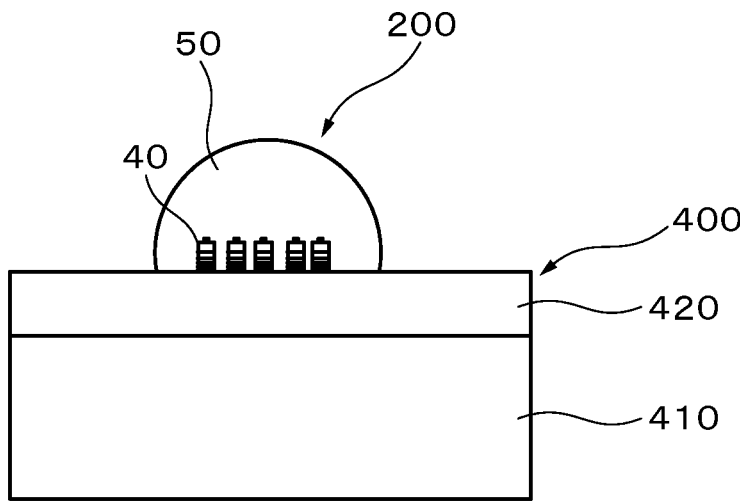
FIG. 8 A cross-sectional view showing the state where the vertical micro LED chips in the ink ejected to the chip joining part of the mounting substrate are brought into contact with the chip joining part in the method of manufacturing a micro LED integrated device according to the first embodiment of the invention.

Then, as shown by the arrow in FIG. 4, the mounting substrate 400 is moved by the transporting mechanism not illustrated by a predetermined distance such that the chip joining part 421 to which the ink 200 is ejected positions over the magnetic field applying device 311 and thereafter the magnetic field is applied by the magnetic field applying device 311 to magnetize the Ni films contained in the p-side electrodes 17 of the vertical micro LED chips 40 contained in the ink 200. Therefore, each of the vertical micro LED chips 40 is attracted downwardly in the ink 200 by a magnetic force and finally brought into contact with the chip joining part 421 with the p-side electrode 17 facing downward. This situation is shown in FIG. 8. In this state, the vertical micro LED chips 40 are made in contact with the chip joining part 421 in random arrangement. In order to prevent the vertical micro LED chips 40 from falling or shifting due to external factors such as vibration, perturbation and the like, application of the magnetic field by the magnetic field applying device 310 is carried out preferably at a time point before ejection of the ink 200 or at the time of ejection or at a time point from the time of ejection and before the liquid 50 of the ink 200 evaporates, for example within 60 seconds from the time of ejection.

Then, the ink 200 is heated to evaporate the solvent by lamp and the like while each of the vertical micro LED chips 40 is made contact with the chip joining part 42 by the magnetic force, and subsequently the Sn film 16 of each of the vertical micro LED chips 40 is heated by lamp, laser and the like to make melt. Thereafter, by cooling of the molten Sn, the p-side electrode 17 of the vertical micro LED chip 40 is joined electrically and mechanically to the chip joining part 421 of the lower electrode 420.

Figure 9A:
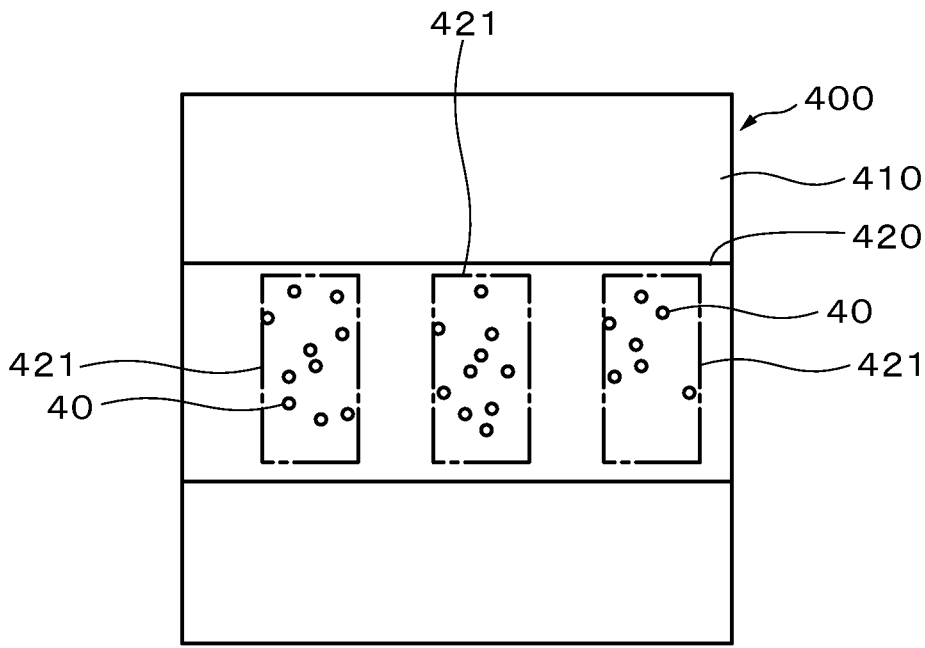
FIG. 9A A plan view showing the state where the vertical micro LED chips are joined to the chip joining parts of the mounting substrate in the method of manufacturing a micro LED integrated device according to the first embodiment of the invention.
Figure 9B:
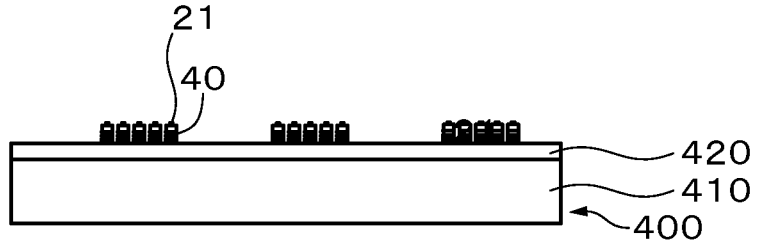
FIG. 9B A cross-sectional view showing the state where the vertical micro LED chips are joined to the chip joining parts of the mounting substrate in the method of manufacturing a micro LED integrated device according to the first embodiment of the invention.

Similarly, the p-side electrode 17 of the vertical micro LED chips 40 is joined electrically and mechanically to each of the chip joining part 421 of the lower electrode 420. FIG. 9A and FIG. 9B show this state. As shown in FIG. 9A, the vertical micro LED chips 40 are joined to each chip joining part 421 in random arrangement.

Figure 10A:
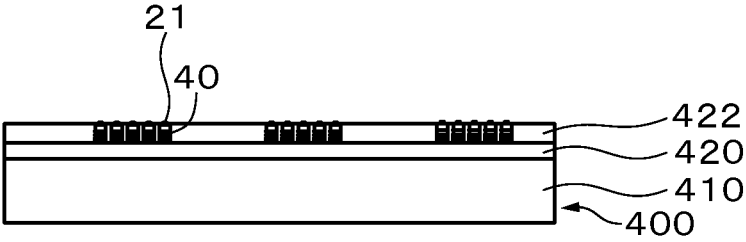
FIG. 10A A cross-sectional view showing the method of manufacturing a micro LED integrated device according to the first embodiment of the invention.

Then, as shown in FIG. 10A, after an insulating film 422 is formed on the whole surface of the mounting substrate 400 in which the vertical micro LED chips 40 are joined to the chip joining part 421 such that the surface of the insulating film 422 is almost flat, the insulating film 422 is etched by, for example, the RIE method to expose the n-side electrode 21.

Figure 10B:
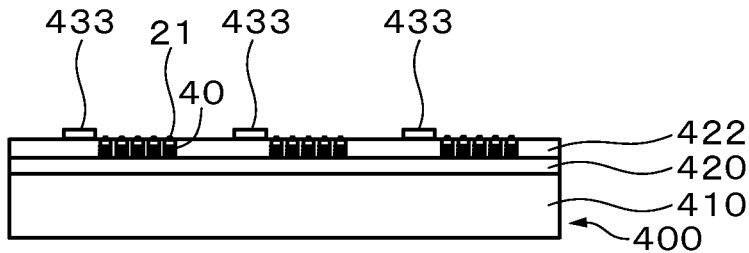
FIG. 10B A cross-sectional view showing the method of manufacturing a micro LED integrated device according to the first embodiment of the invention.

Then, as shown in FIG. 10B, formed are thin film fuses 433 which are respectively connected between an upper electrode main line part 431 and a plurality of upper electrode branch line parts 431 which will be described later. The thin film fuses 433 can be formed by, for example, forming a photoresist having openings having a predetermined shape corresponding to the thin film fuse 433 on the insulating film 422, forming a metal film thereon by a vacuum evaporation and thereafter lifting off the photoresist. The thin film fuse 433 is made of a metal thin film having a melting point not lower than 150° C. and not higher than 350° C. The metal thin film is, for example, simple metal such as In, Sn and the like or alloys such as InSn, InSnAg, AgSn, AuSn and the like.

Figure 10C:
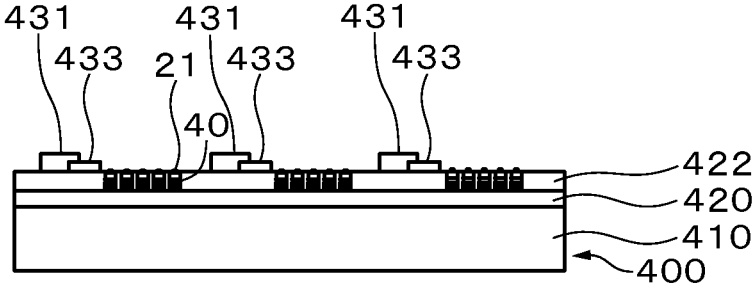
FIG. 10C A cross-sectional view showing the method of manufacturing a micro LED integrated device according to the first embodiment of the invention.

Then, as shown in FIG. 10C, formed on the insulating film 422 is a plurality of upper electrode main line parts 431 which extend in the direction at a right angle to the lower electrode 420 and are parallel to each other such that the upper electrode main line part 431 overlaps one end of the thin film fuse 433.

Figure 10D:
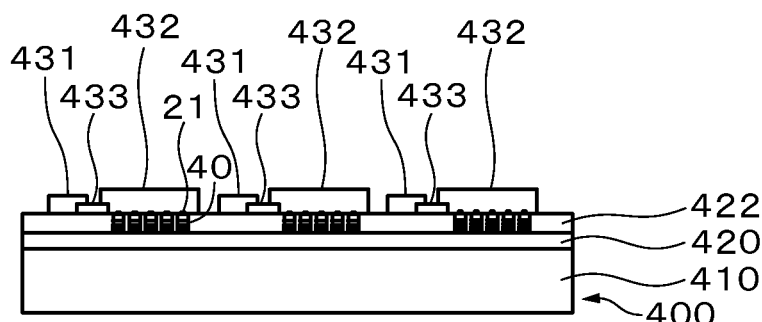
FIG. 10D A cross-sectional view showing the method of manufacturing a micro LED integrated device according to the first embodiment of the invention.
Figure 11:
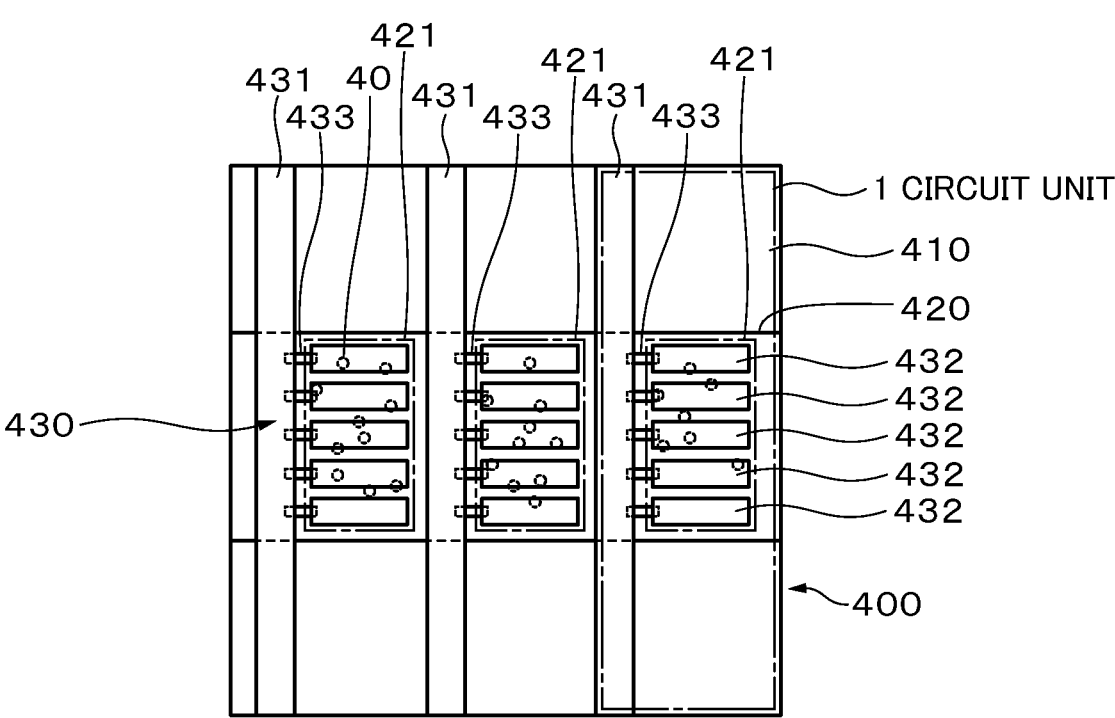
FIG. 11 A plan view showing the method of manufacturing a micro LED integrated device according to the first embodiment of the invention.
Figure 12A:
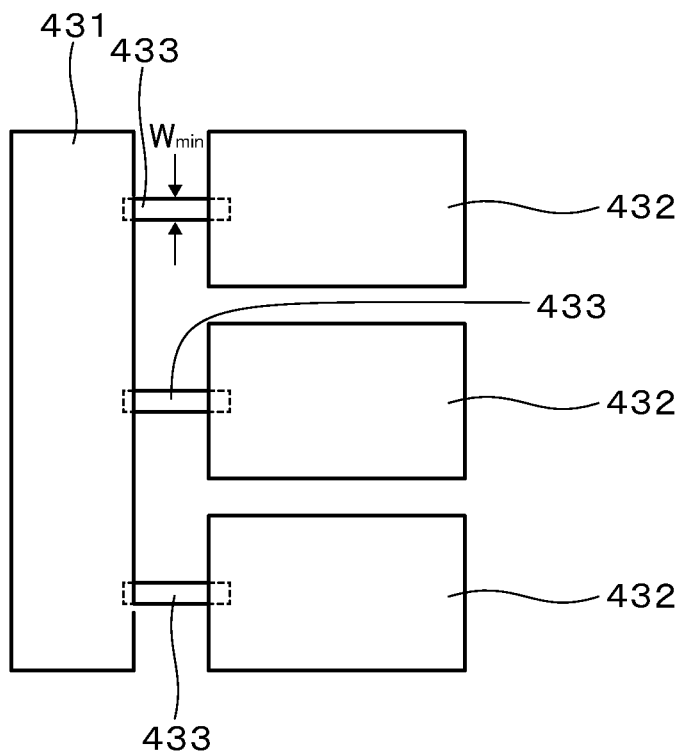
FIG. 12A An enlarged plan view showing the thin film fuse shown in FIG. 11 and the area adjacent to it.
Figure 12B:
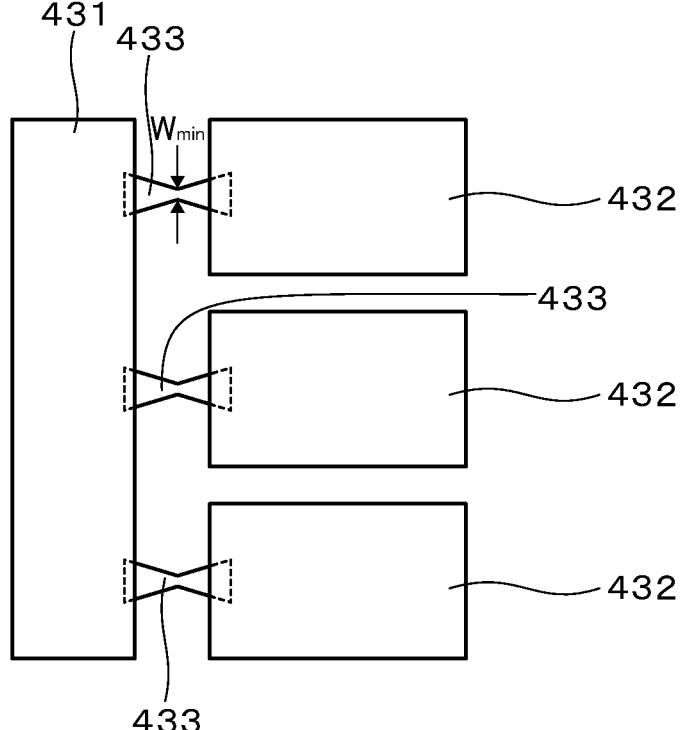
FIG. 12B An enlarged plan view showing another thin film fuse which is different from the thin film fuse shown in FIG. 12A and the area adjacent to it.

Then, as shown in FIG. 10D, formed on the insulating film 422 parallel to each other are a plurality of upper electrode branch line parts 432 for each chip joining part 421 which connect the n-side electrode 21 of the vertical micro LED chip 40 and the upper electrode main line part 431 (in this example, the number of upper electrode branch line parts 432 is 5) via the thin film fuse 433. The upper electrode branch line part 432 is made of transparent electrode materials such as ITO and the like. The upper electrode branch line parts 432 are formed such that they overlap the other end of the thin film fuse 433 and cover almost the whole of each chip joining part 421. The upper electrode main line part 431 and the upper electrode branch line parts 432 which are connected via the thin film fuse 433 form an upper electrode 430. FIG. 11 shows a plan view of this state. As shown in FIG. 11, the upper electrode branch line parts 432 are formed such that they extend over the vertical micro LED chips 40 which are arranged on each chip joining part 421. Among the upper electrode branch line parts 432, there may be upper electrode branch line parts 432, a part of which is made contact with the n-side electrode 21 of the vertical micro LED chip 40, or there may be upper electrode branch line parts 432 which are not made contact with the n-side electrode 21 of the vertical micro LED chip 40. However, a part of at least one upper electrode branch line part 432 is made contact with the n-side electrode 21 of at least one, typically a plurality of vertical micro LED chips 40. In FIG. 11, an area covered by a circuit unit which on/off can be controlled electrically is shown by a dashed-and-dotted line. The light emitting area of the vertical micro LED chip 40 is typically selected to be not larger than a thousandth of the area covered by one circuit unit. FIG. 12A shows an enlarged view of the thin film fuse 433 and the upper electrode main line part 431 and the upper electrode branch line parts 432 adjacent to the thin film fuse 433. Although the thin film fuse 433 has a rectangular shape, the thin film fuse 433 may have a planar shape having a constricted middle part as shown in FIG. 12B. As shown in FIG. 12A and FIG.

12B, if the width of the narrowest part of the thin film fuse 433 is denoted as $W_{min}$ and its thickness is denoted as $T_{min}$, $W_{min}$ and $T_{min}$ are selected such that $W_{min} \times T_{min} < 0.5 \, \mu m^2$ is satisfied.

Figure 13A:
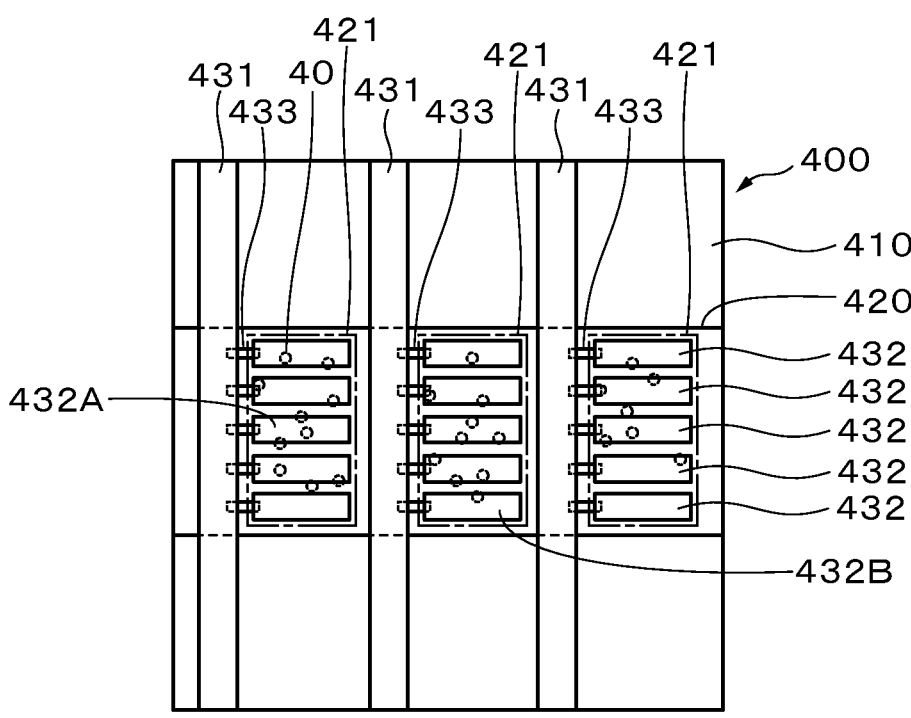
FIG. 13A A plan view for explaining a method of testing the micro LED integrated device manufactured by the method of manufacturing a micro LED integrated device according to the first embodiment of the invention.
Figure 13B:
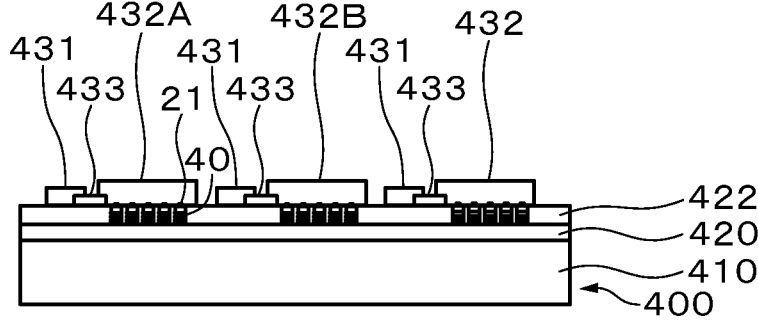
FIG. 13B A cross-sectional view for explaining the method of testing the micro LED integrated device manufactured by the method of manufacturing a micro LED integrated device according to the first embodiment of the invention.

Thereafter, a test of the micro LED integrated device manufactured as described above is carried out. More specifically, a voltage is applied between the upper electrode 430 and the lower electrode 420 such that the voltage of the lower electrode 420 is higher than that of the upper electrode 430 to make current of, for example, about 1 μA flow through each vertical micro LED chip 40. And image analysis of emission of light of each vertical micro LED chip 40 is carried out to find the upper electrode branch line part 432 with defection of light quantity due to leakage of the vertical micro LED chips 40. In FIG. 13A and FIG. 13B, the upper electrode branch line parts 432 with defection of light quantity are shown by reference numerals 432A and 432B.

Figure 14A:
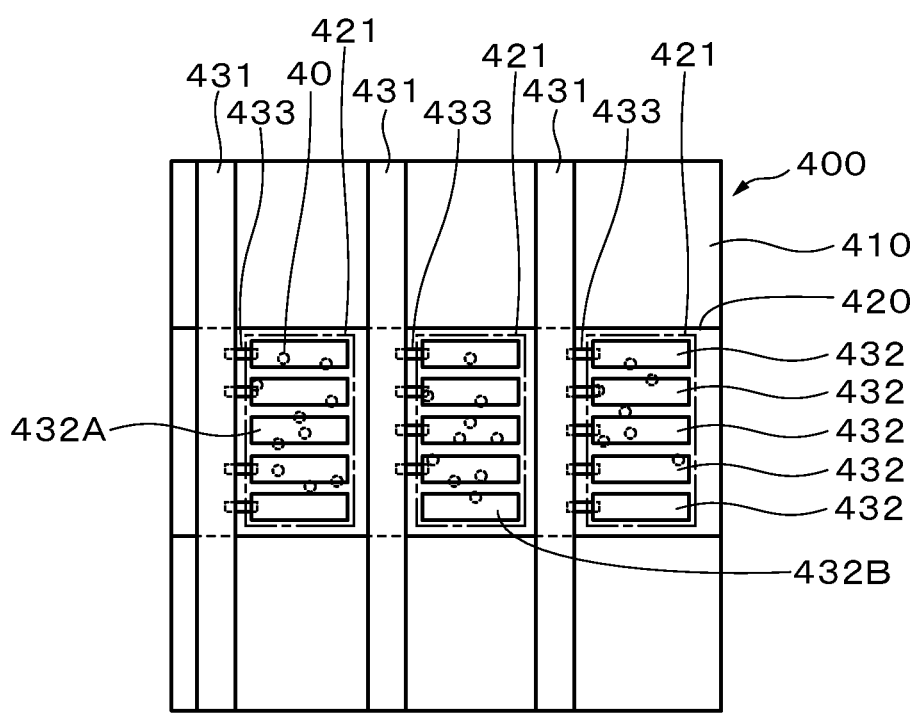
FIG. 14A A plan view for explaining a method of repairing the micro LED integrated device manufactured by the method of manufacturing a micro LED integrated device according to the first embodiment of the invention.
Figure 14B:
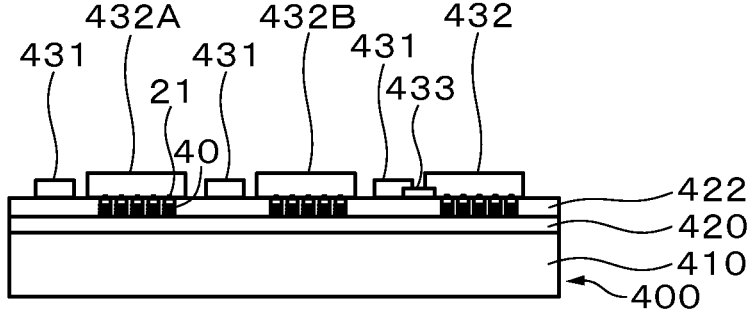
FIG. 14B A cross-sectional view for explaining the method of repairing the micro LED integrated device manufactured by the method of manufacturing a micro LED integrated device according to the first embodiment of the invention.

Then, an appropriate voltage, for example, a voltage not larger than the threshold voltage of the vertical micro LED chip 40 or a voltage slightly larger than the threshold voltage (for example, about 3~3.4 V) is applied between the upper electrode branch line parts 432A, 432B with defection of light quantity and the upper electrode main line part 431 connected to the upper electrode branch line parts 432A, 432B via the thin film fuse 433. As a result, a large current flows between the upper electrode branch line parts 432A, 432B and the upper electrode main line part 431 connected to the upper electrode branch line parts 432A, 432B via the thin film fuse 433 and the thin film fuse 433 melts and is cut. FIG. 14A and FIG. 14B show the state where the thin film fuse 433 between the upper electrode main line part 431 and the upper electrode branch line parts 432A, 432B is cut.

Thereafter, a test is carried out again. That is, current of, for example, about 1 μA is made to flow to carry out image analysis of emission of light of each vertical micro LED chip 40. And when no upper electrode branch line part 432 with defection of light quantity is found, repair is finished. In this way, repair of the micro LED integrated device can be carried out.

(6) Structure of the Micro LED Integrated Device

As shown in FIG. 10D and FIG. 11, the micro LED integrated device has the mounting substrate 400 having the lower electrode 420 on one major surface, the chip joining parts 421 provided on the lower electrode 420, a plurality of vertical micro LED chips 40, each of which has the n-side electrode 21 and the p-side electrode 17 on the upper surface and the lower surface and is configured such that the p-side electrode 17 side is more strongly attracted to a magnetic field than the n-side electrode 21 side, which are joined to the chip joining parts 421 in random arrangement, and the upper electrode 430 as the upper layer of the vertical micro LED chips 40 having the upper electrode main line part 431 and a plurality of upper electrode branch line parts 432 which are connected to the upper electrode main line part 431 via the thin film fuse 433. And, the vertical micro LED chips 40 are joined to the chip joining part 421 such that the p-side electrode 17 side faces the chip joining part 421. The n-side electrode 21 and the upper electrode 430 are electrically connected each other. The n-side electrode 21 of at least one vertical micro LED chip 40 and the upper electrode branch line parts 432 of the upper electrode 430 are electrically connected each other.

As described above, according to the first embodiment, the vertical micro LED chip 40 is configured such that the p-side electrode 17 side is more strongly attracted to a magnetic field than the n-side electrode 21 side by using the p-side electrode 17 containing the Ni films, which are soft magnetic materials, and further a plurality of chip joining parts 421 are formed, for example in a two-dimensional array, on the lower electrode 420 of the mounting substrate 400. And the ink 200 containing a plurality of vertical micro LED chips 40, usually a large number of vertical micro LED chips 40 is ejected to the chip joining part 421 of the lower electrode 420 of the mounting substrate 400 from the ejection nozzle 308 of the inkjet print head 301 of the ink ejection device 300. Then, the p-side electrode 17 side of the vertical type micro LED chip 40 is attracted to the chip joining part 421 of the lower electrode 420 by a magnetic force to be brought into contact with the chip joining part 421. Thereafter, the Sn film 16 is made melt and solidified to connect the p-side electrode 17 of the vertical micro LED chip 40 and the chip joining part 421 of the lower electrode 420 electrically and mechanically, whereby a micro LED integrated device such as, for example, a micro LED display, a micro LED backlight, a micro LED illumination device and the like can be easily realized at low cost. Furthermore, since it is sufficient to join the vertical micro LED chips 40 to the chip joining part 421 in random arrangement, high precision position control of the vertical micro LED chips 40 is not necessary, which simplifies manufacturing of the micro LED integrated device. Since a plurality of vertical micro LED chips 40 are joined to each chip joining part 421 in random arrangement and a plurality of upper electrode branch line parts 432 extend so as to cover almost all of the chip joining part 421, it is possible to prevent the case where no vertical micro LED chip 40 is connected between the lower electrode 420 and the upper electrode 430 in each circuit unit from occurring. Therefore, it is possible to prevent defection of the micro LED integrated device from occurring. Furthermore, even if there occurs defection of the vertical micro LED chips 40 on the mounting substrate 400, it is possible to repair by cutting off the thin film fuse 433 between the upper electrode branch line parts 432 to which the defective vertical micro LED chips 40 are connected and the upper electrode main line part 431.

The Second Embodiment

[Method of Manufacturing a Micro LED Integrated Device]

In the first embodiment, ejection of the ink 200 and subsequent mounting of the vertical micro LED chips 40 on the mounting substrate 400 are carried out by using the ink ejection device 300 and the magnetic field applying device 311 shown in FIG. 4. The second embodiment differs from the first embodiment in that ejection of the ink 200 and subsequent mounting of the vertical micro LED chips 40 on the mounting substrate 400 are carried out by using the ink ejection device 300, magnetic field applying devices 311, 312, 313 and heating devices 321, 322 shown in FIG. 15.

Figure 15:
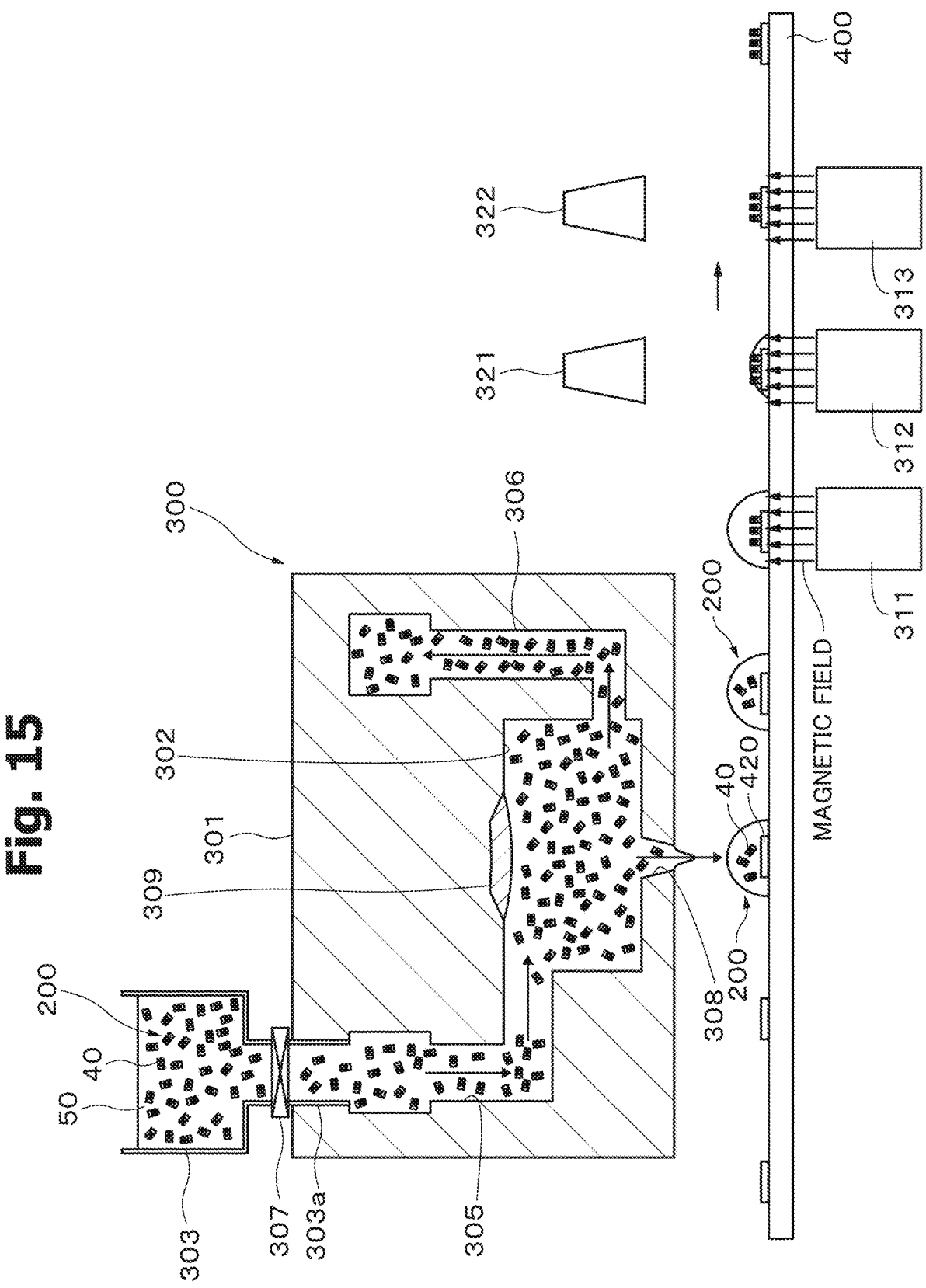
FIG. 15 A schematic view showing an ink ejection device which is used in a method of manufacturing a micro LED integrated device according to a second embodiment of the invention.

As shown in FIG. 15, the magnetic field applying devices 311, 312, 313 are placed at positions sequentially away from the inkjet print head 301 in the horizontal direction. The heating device 321 using a lamp and the like is disposed over the magnetic field applying device 312. The heating device 321 is used to evaporate the liquid 50 of the ink 200. The heating device 322 using a lamp, a laser and the like is disposed over the magnetic field applying device 313. The heating device 322 is used to make melt the Sn film 16 of the vertical micro LED chip 40. The heating devices 321, 322 are disposed at predetermined heights such that the mounting substrate 400 is sandwiched between the magnetic field applying devices 311, 312, 313 and the heating devices 321, 322. The mounting substrate 400 is moved at a height between the inkjet print head 301 and the magnetic field applying devices 311, 312, 313.

In the second embodiment, as the same as the first embodiment, the ink 200 is ejected from the ejection nozzle 308 to the chip joining part 421 of the lower electrode 420 of the mounting substrate 400, and the magnetic field is applied by the magnetic field applying device 311 at a time point before ejection of the ink 200 or at the time of ejection or at a time point within 60 seconds from the time of ejection. While each of the vertical micro LED chips 40 are made contact with the chip joining part 421 by a magnetic force, the mounting substrate 400 is moved further and at a time point where the chip joining part 421 with which the vertical micro LED chips 40 are made contact reaches just below the heating device 321, heating is carried out by a lamp and the like to evaporate the liquid 50 of the ink 200. In the state where the chip joining part 421 with which the vertical micro LED chips 40 are made contact reaches just below the heating device 321, the contact state of the vertical micro LED chips 40 with the chip joining part 421 is kept by applying a magnetic field by the magnetic field applying device 312. Then, the mounting substrate 400 is moved further and at a time point where the chip joining part 421 with which the vertical micro LED chips 40 are made contact reaches just below the heating device 322, heating is carried out by a lamp, a laser and the like to make melt the Sn film 16 of each of the vertical micro LED chips 40. Thereafter, while the mounting substrate 400 is moved further, molten Sn is cooled to solidify, whereby the p-side electrode 17 of each vertical micro LED chip 40 is joined electrically and mechanically to the lower electrode 420.

Similarly, the p-side electrode 17 of the vertical micro LED chip 40 is joined electrically and mechanically to each chip joining part 421 of the lower electrode 420.

Others are the same as the first embodiment.

According to the second embodiment, another advantage can be obtained in addition to the same advantages as the first embodiment. That is, steps from ejection of the ink 200 to the chip joining part 421 of the lower electrode 420 of the mounting substrate 400 to electrical and mechanical joining of the vertical micro LED chips 40 to the chip joining part 421 can be continuously and easily carried out.

[Method of Manufacturing a Micro LED Integrated Device]

Figure 16:
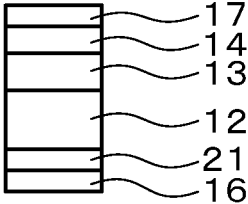
FIG. 16 A cross-sectional view showing a vertical micro LED chip which is used in a method of manufacturing a micro LED integrated device according to a third embodiment of the invention.

The third embodiment differs from the first embodiment in that the vertical micro LED chip 40 shown in FIG. 16 is used. As shown in FIG. 16, the vertical micro LED chip 40 differs from the vertical micro LED chip 40 used in the first embodiment in that the p-side electrode 17 is made of an ITO film, the n-side electrode 21 is formed on the n$^+$-type GaN layer 12 as a full-surface electrode, the n-side electrode 21 is made of a Al/Ni/Au layered film and contains Ni films, which are soft magnetic materials, and the Sn film 16 is formed on the n-side electrode 21. The vertical micro LED chip 40 is configured such that the n-side electrode 21 side is more strongly attracted to a magnetic field than the p-side electrode 17 side.

Planar shapes of the vertical micro LED chip 40 are the same as shown in FIG. 2A, FIG. 2B and FIG. 2C.

The vertical micro LED chip 40 can be manufactured by conventionally publicly known method.

According to the third embodiment, the same advantages as the first embodiment can be obtained.

The Fourth Embodiment

[Color Micro LED Display]

In the fourth embodiment, a passive matrix driving system color micro LED display is described.

Figure 17:
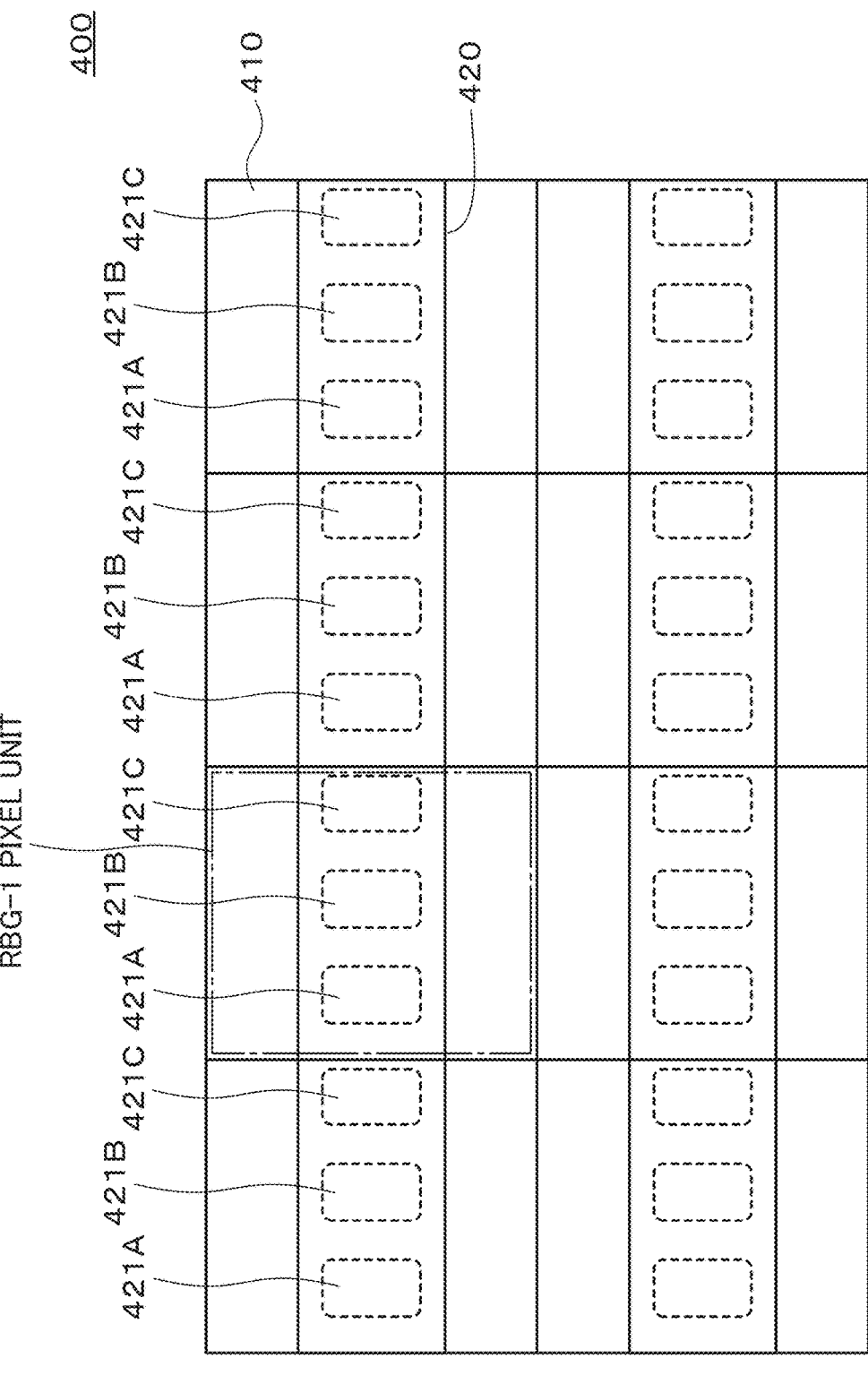
FIG. 17 A plan view showing a mounting substrate of a passive driving system color micro LED display according to a fourth embodiment of the invention.

FIG. 17 shows lower electrodes 420 on the mounting substrate 400 of the color micro LED display. As shown in FIG. 17, lower electrodes 420 are formed parallel to each other in the row direction. RGB-1 pixel units, each of which is formed by arranging light emitting areas of each of RGB adjacently each other along each lower electrode 420 are arranged and as a whole of the mounting substrate 400 pixels are arranged in a two-dimensional matrix. In each pixel, three chip joining parts 421A, 421B, 421C are formed on the lower electrode 420 and they correspond to, for example, light emitting areas of each of B, R, G.

Figure 18:
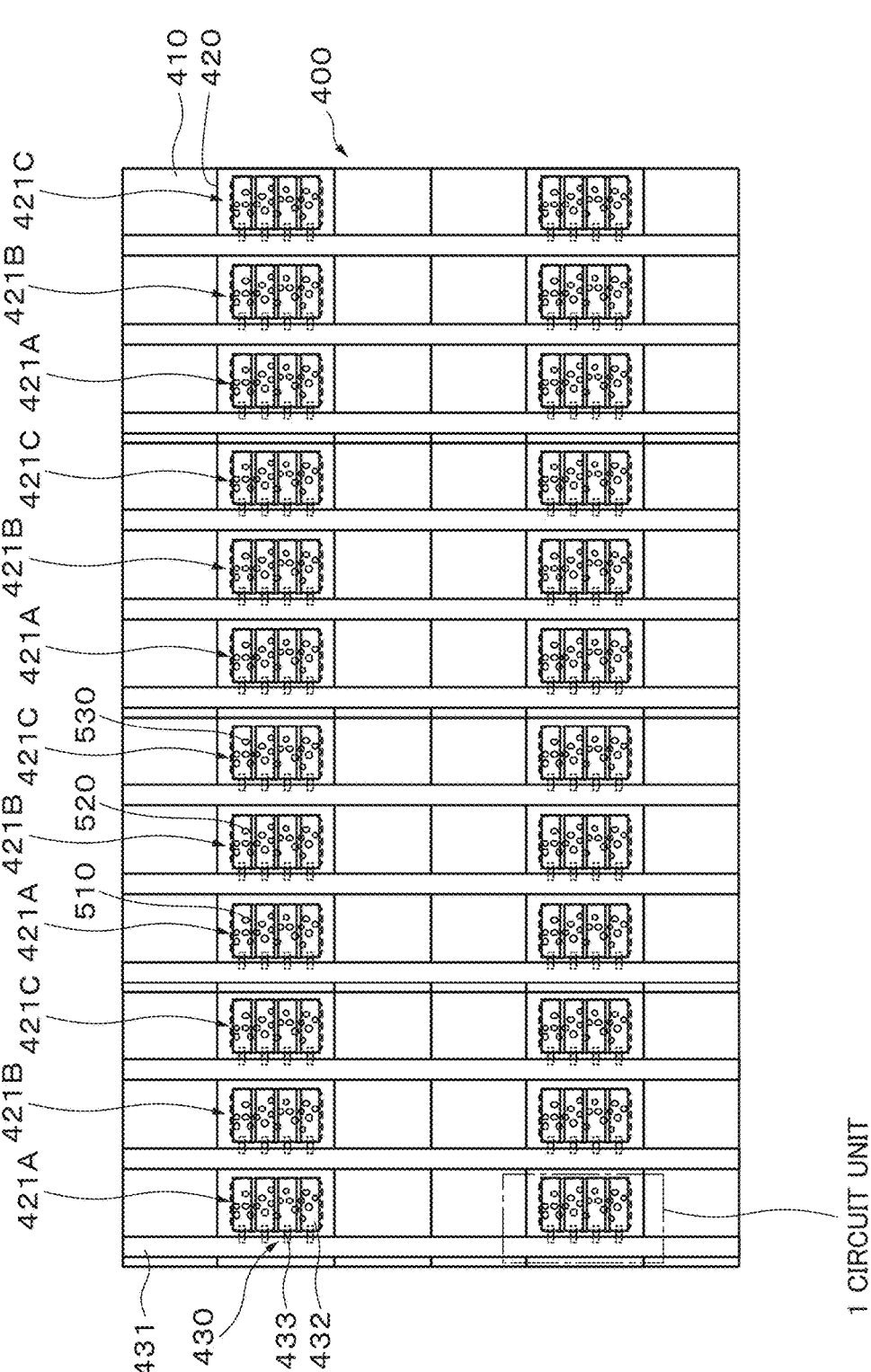
FIG. 18 A plan view showing the passive driving system color micro LED display according to the fourth embodiment of the invention.

FIG. 18 shows the state where vertical micro LED chips for light emission of each of RGB are mounted on the mounting substrate 400 as the same as the first embodiment and the upper electrode 430 is formed. More specifically, blue light emission vertical micro LED chips 510 are randomly arranged on the chip joining part 421A, red light emission vertical micro LED chips 520 are randomly arranged on the chip joining part 421B and green light emission vertical micro LED chips 530 are randomly arranged on the chip joining part 421C. The upper electrode 430 is formed along the chip joining parts 421A, 421B, 421C in the column direction. Each upper electrode branch line part 432 which is connected with the upper electrode main line part 431 of each upper electrode 420 via the thin film fuse 433 is connected with an n-side electrode of the vertical micro LED chips 510 on the chip joining part 421A, an n-side electrode of the vertical micro LED chips 520 on the chip joining part 421B and an n-side electrode of the vertical micro LED chips 530 on the chip joining part 421C. Selection of light emitting areas of each pixel is carried out by selection of the lower electrode 420 and the upper electrode 430. FIG. 18 shows one circuit unit. The number of the vertical micro LED chips in one circuit unit is typically not less than 10, but not limited to this.

The blue light emission vertical micro LED chip 510 and the green light emission vertical micro LED chip 530 have the same structure as the vertical micro LED chip 40 according to the first embodiment, though composition of their light emitting layers 13 are different each other. The red light emission vertical micro LED chip 520 uses AlGaInP-based semiconductor and uses an n$^+$-type AlGaInP layer, a light emitting layer having In$_x$Ga$_{1-x}$P/In$_y$Ga$_{1-y}$P MQW structure and a p-type AlGaInP layer instead of the n$^+$-type GaN layer 12, the light emitting layer 13 and the p-type GaN layer 14 of the vertical micro LED chip 40. A p-side electrode is formed on the p-type AlGaInP layer and an n-side electrode is formed on the n$^+$-type AlGaInP layer. The p-side electrode contains Ni films and the like as soft magnetic materials as the same as the p-side electrode 17. Some manufacturing methods of the red light emission AlGaInP-based semiconductor vertical micro LED chip are known. Although details of steps are omitted, the red light emission AlGaInP-based semiconductor vertical micro LED chip can be manufactured by using a GaAs substrate as a substrate and forming first an AlAs layer as a sacrificing layer, growing AlGaInP-based semiconductor layers epitaxially on the AlAs layer, forming electrodes, carrying out device isolation and the like and thereafter separating the GaAs substrate by carrying out wet etching with hydrofluoric acid-base etchant.

By dispersing the blue light emission vertical micro LED chips 510, the red light emission vertical micro LED chips

520 and the green light emission vertical micro LED chips 530 in a liquid, respectively, inks can be prepared. Regarding an ink ejection device, for example, three ink chambers are disposed adjacent to the inkjet print head 301 of the ink ejection device 300 shown in FIG. 4, three kinds of inks are filled up in the ink chambers, respectively, three ejection nozzles are formed in the inkjet print head which can eject three kinds of the inks independently from each other and three kinds of inks are ejected from each ejection nozzle by operating a piezoactuator.

According to the fourth embodiment, it is possible to mount vertical micro LED chips for light emission of each of RGB on the mounting substrate 400 easily, efficiently and in a very short time and to remove effects of defective vertical micro LED chips easily, whereby a high performance passive driving system color micro LED display can be realized at low cost. Furthermore, a plurality of vertical micro LED chips are joined to the chip joining parts 421A, 421B, 421C, which correspond to light emitting areas of each of B, R and G, respectively. Therefore, even if the size of the vertical micro LED chip is small, brightness can be secured. And even if there exists difference of light emission wavelength among vertical micro LED chips, the light emission wavelength is averaged as a whole and therefore, vertical micro LED chips having the light emission wavelength within permissible range can be used, whereby manufacturing cost of the color micro LED display can be reduced. Similarly, even if there exists difference of light emission intensity among vertical micro LED chips, the light emission intensity is averaged as a whole. This also leads to reduction of manufacturing cost of the color micro LED display. When specification such as pixel size and the like is changed, it is possible to easily cope with it by increasing and decreasing the number of vertical micro LED chips joined to the chip joining parts 421A, 421B, 421C without changing the size of the vertical micro LED chip.

The Fifth Embodiment

[Color Micro LED Display]

In the fifth embodiment, an active matrix driving system color micro LED display is described.

Figure 19:
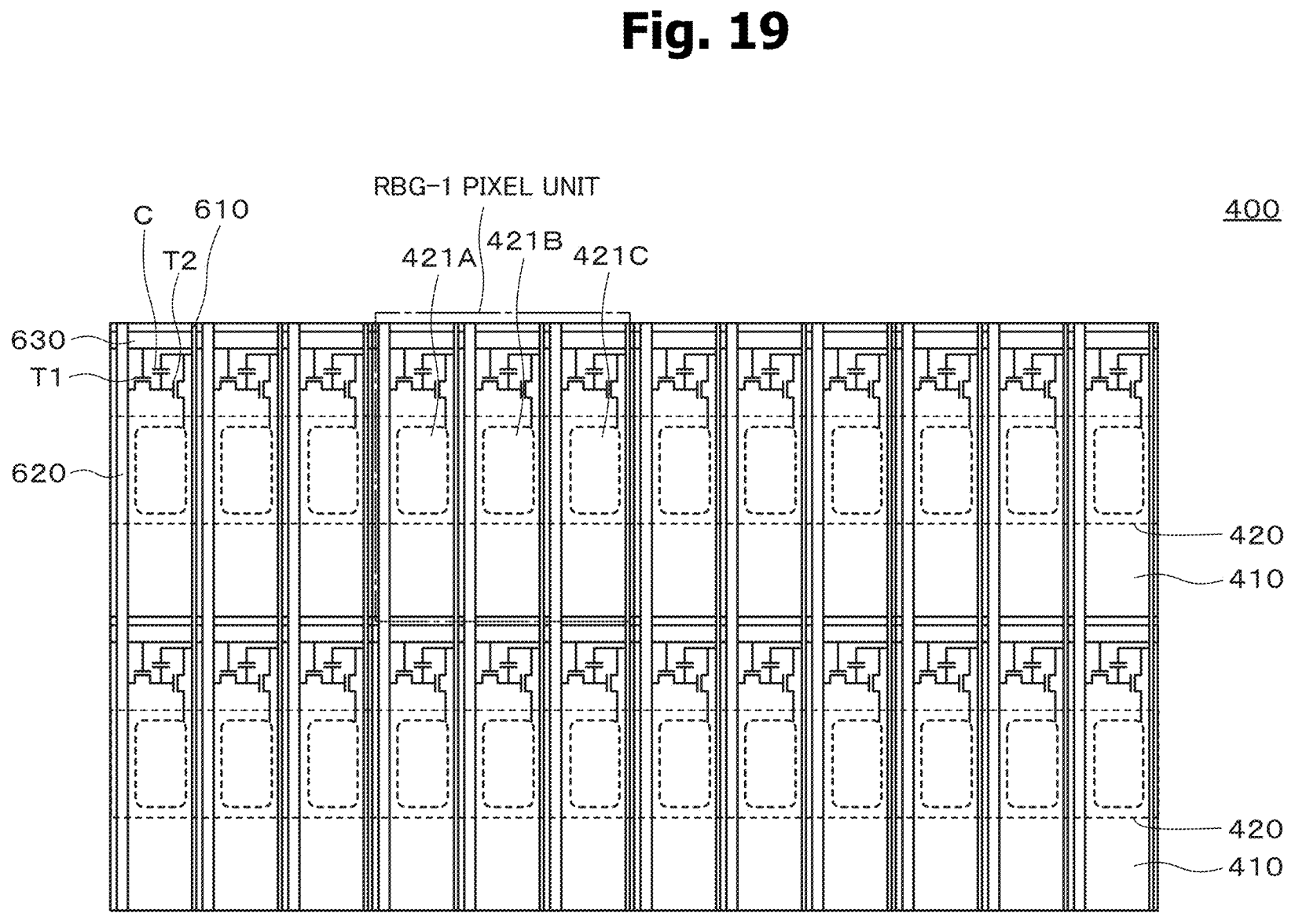

FIG. 19 shows lower electrode wiring lines on the mounting substrate 400 of the color micro LED display. The lower electrodes 420 of the lower electrode wiring lines are provided parallel to each other in the row direction as the same as the fourth embodiment. RGB-1 pixel units, each of which is formed by arranging light emitting areas of each of RGB adjacently each other along each lower electrode 420 are arranged and as a whole of the mounting substrate 400 pixels are arranged in a two-dimensional matrix. In each pixel, three chip joining parts 421A, 421B, 421C are formed on the lower electrode 420 and they correspond to, for example, light emitting areas of B, R, G, respectively. Provided also as the lower electrode wiring lines are power supplying lines 610 and data lines 620 which extend in the column direction and scanning lines 630 which extend in the row direction. An active driving circuit is provided between each data line 620 and each light emitting area of each pixel. Each light emitting area of each pixel is selected by the active driving circuit. The active driving circuit is configured by transistors T1, T2 and a condenser C. The transistors T1, T2 are generally configured by a thin film transistor which uses a semiconductor thin film such as a polycrystalline Si thin film and the like. The condenser C is configured by stacking a lower electrode, an insulating film and an upper electrode. Source, drain and gate of the transistor T1 are connected with the data line 620, gate of the transistor T2 and the scanning line 630, respectively. Source and drain of the transistor T2 are connected with the power supplying line 610 and the lower electrode 420, respectively. The condenser C is connected between drain of the transistor T1 and the power supplying line 610. Each light emitting area of each pixel is selected by selection of the scanning line 630 and the data line 620.

Figure 20:
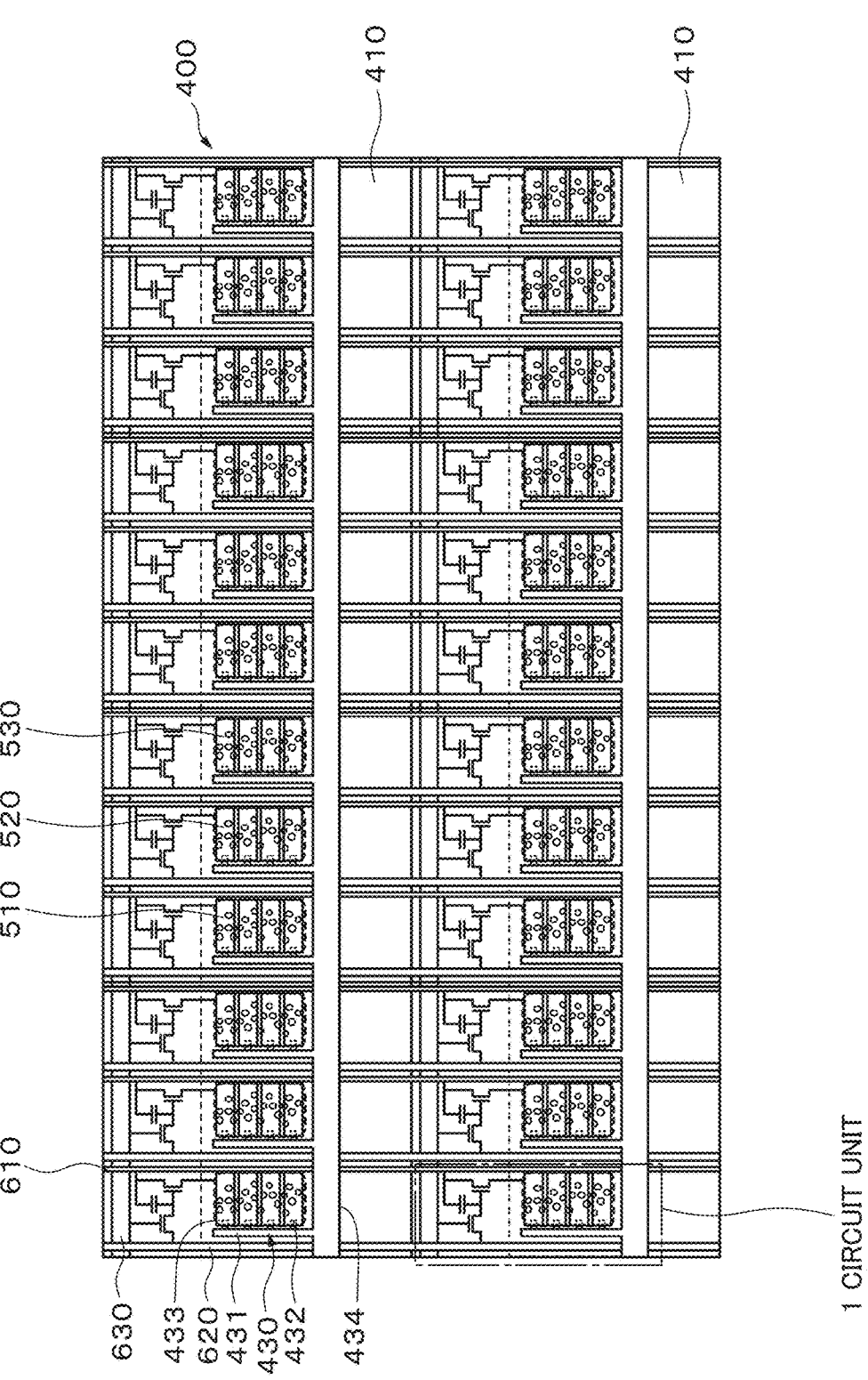
FIG. 20 A plan view showing the active driving system color micro LED display according to the fifth embodiment of the invention.

FIG. 20 shows the state where the blue light emission vertical micro LED chips 510, the red light emission vertical micro LED chips 520 and the green light emission vertical micro LED chips 530 are mounted on the mounting substrate 400 as the same as the fourth embodiment and the upper electrode 430 is formed. The upper electrode 430 has a common electrode part 433 which connects each upper electrode main line part 431. FIG. 20 shows one circuit unit. The number of vertical micro LED chips in one circuit unit is typically not less than 10, but not limited to this.

The blue light emission vertical micro LED chip 510, the red light emission vertical micro LED chip 520 and the green light emission vertical micro LED chip 530 are the same as those used in the fourth embodiment. Three kinds of inks and the ink ejection device are the same as the fourth embodiment.

According to the fifth embodiment, it is possible to mount vertical micro LED chips for light emission of each of RGB on the mounting substrate 400 easily, efficiently and in a very short time and to remove effects of defective vertical micro LED chips easily, whereby a high performance active driving system color micro LED display can be realized at low cost. Furthermore, the same advantages as the fourth embodiment can be obtained.

The Sixth Embodiment

In the first embodiment, described is about the micro LED integrated device in which the thin film fuse 433 is connected between the upper electrode main line part 431 of the upper electrode 430 and the upper electrode branch line parts 432. In contrast to this, in the sixth embodiment, described is about the micro LED integrated device in which the thin film fuse is connected between the lower electrode main line part of the lower electrode 420 and lower electrode branch line parts.

(1) Mounting Substrate

Figures 21A, 21B:
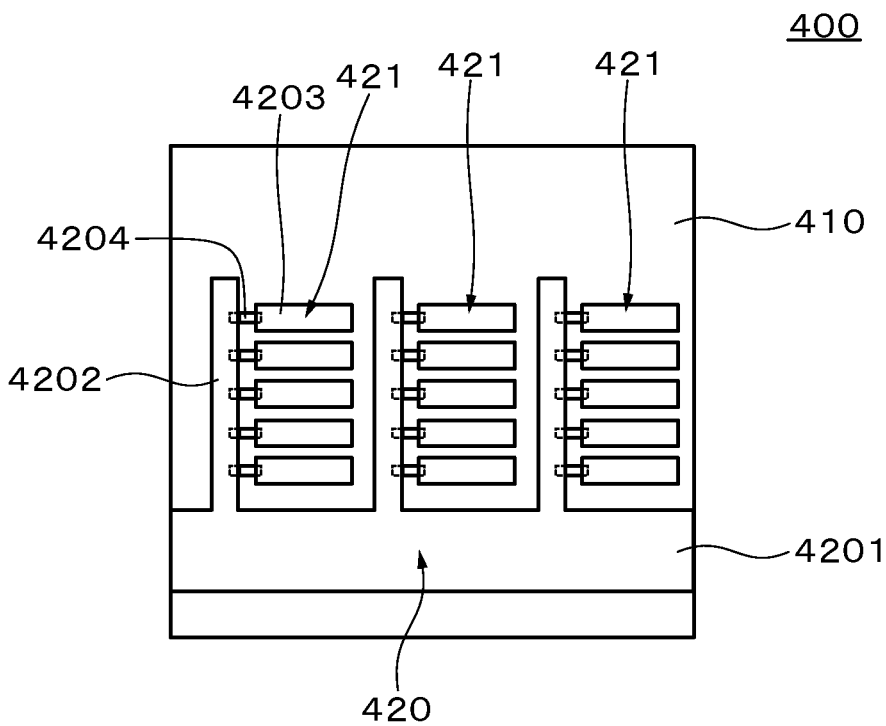
FIG. 21A A plan view showing a mounting substrate which is used in a method of manufacturing a micro LED integrated device according to a sixth embodiment of the invention.
FIG. 21B A cross-sectional view showing the mounting substrate which is used in the method of manufacturing a micro LED integrated device according to the sixth embodiment of the invention.

FIG. 21A and FIG. 21B show the mounting substrate 400 which is used to manufacture the micro LED integrated device. Here, FIG. 21B is a cross-sectional view along lower electrode branch line parts and their neighboring lower electrode main line parts. As shown in FIG. 21A and FIG. 21B, the lower electrode 420 is provided on one major surface of the substrate 410. In this case, the lower electrode 420 comprises a wide lower electrode main line part 4201 which extends in one direction, a lower electrode main line parts 4202 which are narrower than the lower electrode main line part 4201 and branch from the lower electrode main line part 4201 in the direction at right angles to the lower electrode main line part 4201, and a plurality of lower electrode branch line parts 4203 which are provided adjacent to the lower electrode main line parts 4202 and extend in the direction at right angles to the lower electrode main line parts 4202, that is, in the direction parallel to the lower electrode main line part 4201. A thin film fuse 4204 is connected between the lower electrode main line part 4202 and the lower electrode branch line parts 4203 adjacent to the lower electrode main line part 4202. The chip joining part 421 is formed by the upper surface of the lower electrode branch line part 4203. Details of the substrate 410 and materials of the lower electrode 420 are the same as the first embodiment. The thin film fuse 4204 is as the same as the thin film fuse 433 in the first embodiment. The number, width, intervals and the like of the lower electrode branch line parts 4203 are as the same as the upper electrode branch line parts 432 in the first embodiment.

(2) Method of Manufacturing a Micro LED Integrated Device

The vertical micro LED chip 40 and the ink ejection device 300 which are used to manufacture the micro LED integrated device are as the same as the first embodiment.

As the same as the first embodiment, the ink 200 is ejected to the chip joining part 421 which is formed by the upper surface of the lower electrode branch line part 4203 of the mounting substrate 400, the chip joining part 421 to which the ink 200 is ejected is located over the magnetic field applying device 311 and thereafter the magnetic field is applied by the magnetic field applying device 311 to bring each vertical micro LED chip 40 into contact with the chip joining part 421 with the p-side electrode 17 facing downward.

Figure 22A:
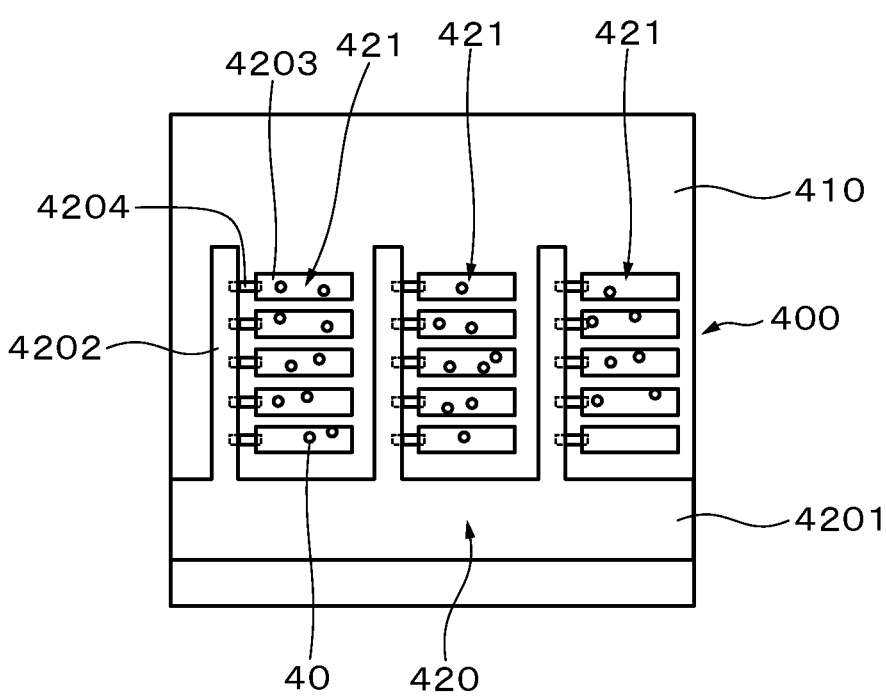
FIG. 22A A plan view showing the method of manufacturing a micro LED integrated device according to the sixth embodiment of the invention.
Figure 22B:
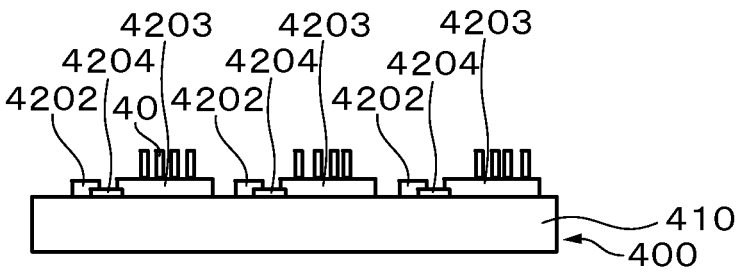
FIG. 22B A cross-sectional view showing the method of manufacturing a micro LED integrated device according to the sixth embodiment of the invention.

Then, as the same as the first embodiment, the p-side electrode 17 of the vertical micro LED chip 40 is joined electrically and mechanically to the chip joining part 421 of the lower electrode 420. Similarly, the p-side electrode 17 of the vertical micro LED chip 40 is joined electrically and mechanically to each of the chip joining parts 421 of the lower electrode 420. FIG. 22A and FIG. 22B show this state.

Figure 23A:
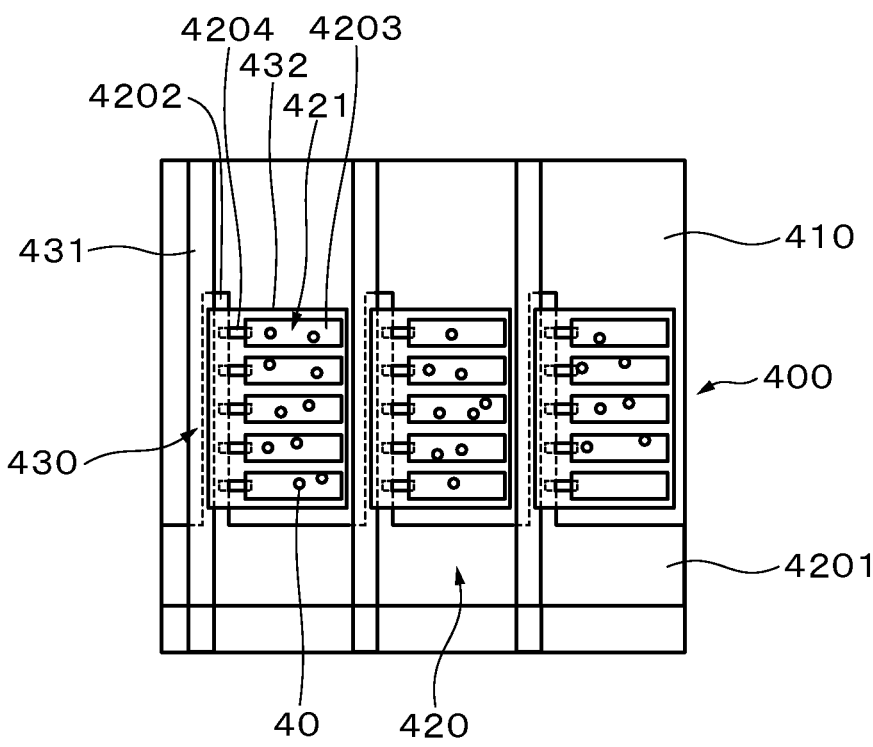
FIG. 23A A plan view showing the method of manufacturing a micro LED integrated device according to the sixth embodiment of the invention.
Figure 23B:
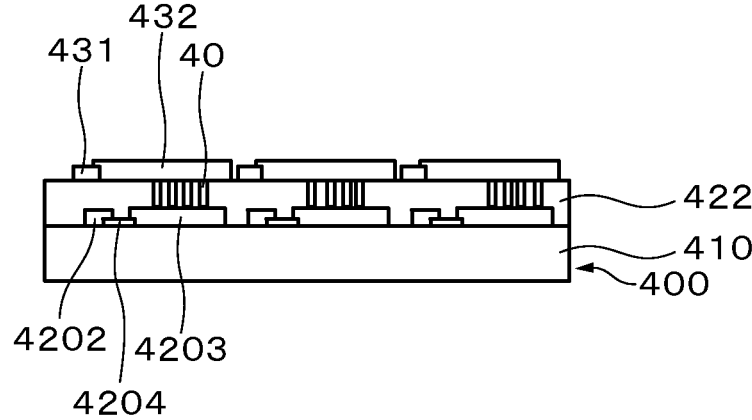
FIG. 23B A cross-sectional view showing the method of manufacturing a micro LED integrated device according to the sixth embodiment of the invention.

Then, as shown in FIG. 23A and FIG. 23B, after the insulating film 422 is formed on the whole surface of the mounting substrate 400 in which the vertical micro LED chips 40 are joined to the chip joining part 421 such that the surface of the insulating film 422 is almost flat, the insulating film 422 is etched by, for example, the RIE method to expose the n-side electrode 21.

Then, formed on the insulating film 422 are a plurality of upper electrode main line parts 431 which are parallel to the lower electrode main line parts 4202 of the lower electrode 420 corresponding to each lower electrode main line part 4202. Thereafter, a single wide upper electrode branch line part 432 is formed such that the upper electrode branch line part 432 partly overlaps the upper electrode main line parts 431 and is electrically connected to it. The upper electrode branch line part 432 is made of transparent electrode materials such as ITO and the like. The upper electrode branch line part 432 is formed such that the upper electrode branch line part 432 covers almost the whole of the lower electrode branch line parts 4203 which are connected to one lower electrode main line part 4202 via the thin film fuse 4204.

Thereafter, a test of the micro LED integrated device manufactured as described above is carried out as the same as the first embodiment. And when the lower electrode branch line parts 4203 with defection of light quantity is found, a voltage not higher than the threshold voltage of the vertical micro LED chip 40 or a voltage slightly higher than the threshold voltage (for example, about 3~3.4 V) is applied between the lower electrode branch line parts 4203 with defection of light quantity and the lower electrode main line part 4202 connected to the lower electrode branch line parts 4202 via the thin film fuse 4204. As a result, a large current flows between the lower electrode branch line parts 4203 and the upper electrode main line part 4202 connected to the upper electrode branch line parts 4203 via the thin film fuse 4204 to make melt and cut the thin film fuse 4204.

Thereafter, a test is carried out again. And when no lower electrode branch line part 4203 with defection of light quantity is found, repair is finished. In this way, repair of the micro LED integrated device can be carried out.

(3) Structure of the Micro LED Integrated Device

As shown in FIG. 23A and FIG. 23B, the micro LED integrated device has the mounting substrate 400 having the lower electrode 420 having the lower electrode main line part 4202 and the lower electrode branch line parts 4203 which are connected each other by the thin film fuse 4204 on one major surface, the chip joining parts 421 formed by the upper surface of the lower electrode branch line part 4203, a plurality of vertical micro LED chips 40, each of which has the n-side electrode 21 and the p-side electrode 17 on the upper surface and the lower surface and is configured such that the p-side electrode 17 side is more strongly attracted to a magnetic field than the n-side electrode 21 side, which are joined to the chip joining parts 421 in random arrangement, and the upper electrode 430 as the upper layer of the vertical micro LED chips 40 having the upper electrode main line part 431 and the upper electrode branch line parts 432 which are connected to the upper electrode main line part 431. And the vertical micro LED chips 40 are joined to the chip joining part 421 such that the p-side electrode 17 side faces the chip joining part 421. The n-side electrode 21 and the upper electrode 430 are electrically connected with each other. The n-side electrode 21 of at least one vertical micro LED chip 40 and the upper electrode branch line parts 432 of the upper electrode 430 are electrically connected each other.

According to the sixth embodiment, it is possible to obtain the same advantages as the first embodiment.

The Seventh Embodiment

[Method of Manufacturing an Ultrafine Pixel Color Micro LED Display]

Figure 24:
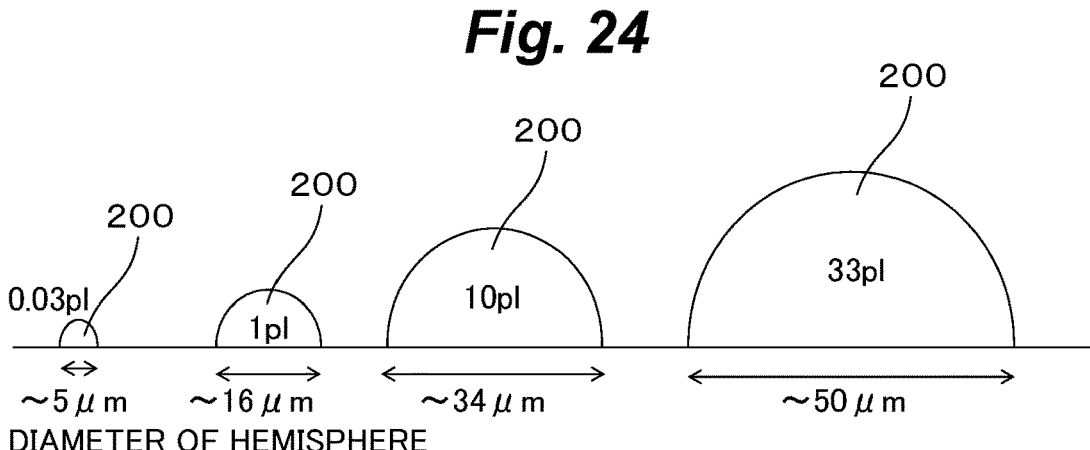
FIG. 24 A schematic view for explaining subjects when an ultrafine pixel micro LED display is manufactured by ejecting the ink using the ink ejection device shown in FIG. 4 or FIG. 15.
Figure 25A:
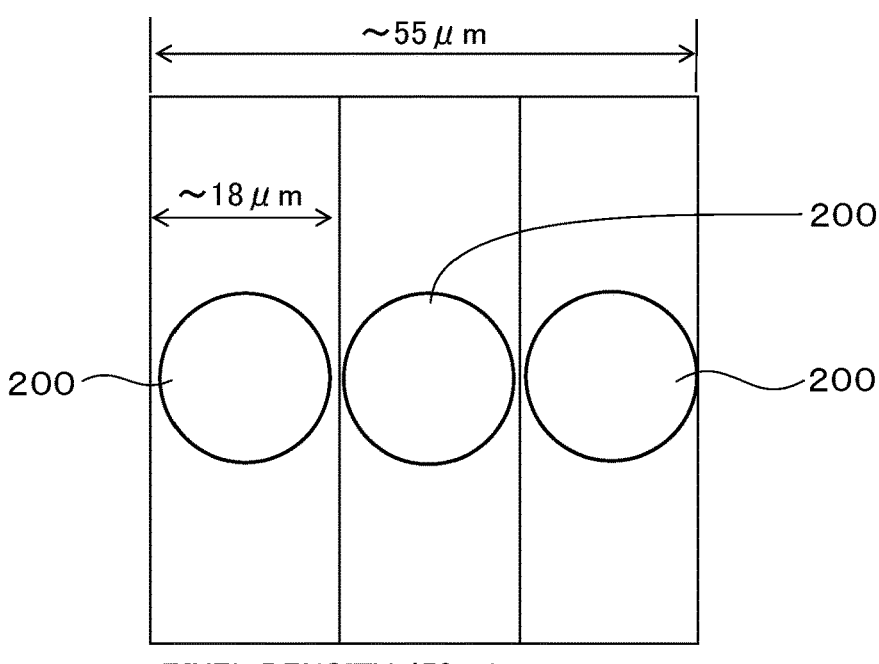
FIG. 25A A schematic view for explaining subjects when the ultrafine pixel micro LED display is manufactured by ejecting the ink using the ink ejection device shown in FIG. 4 or FIG. 15.
Figure 25B:
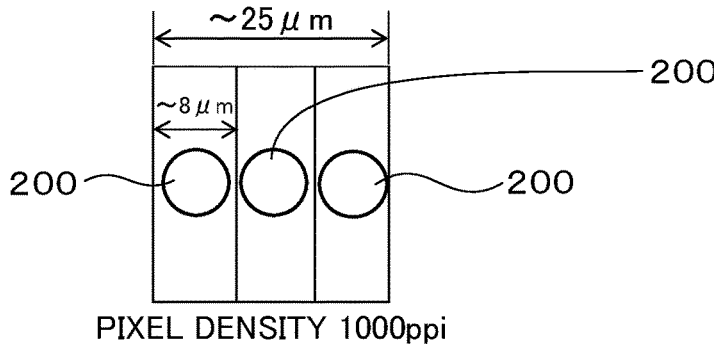
FIG. 25B A schematic view for explaining subjects when the ultrafine pixel micro LED display is manufactured by ejecting the ink using the ink ejection device shown in FIG. 4 or FIG. 15.

FIG. 24 shows the relation between the ejection amount of the ink 200 and the diameter of the droplet when the droplet of the ink 200 is assumed to become hemisphere. For example, the minimum ejection amount of the droplet of the ink 200 which is ejected from the ejection nozzle 308 of the inkjet print head 301 of the ink ejection device shown in FIG. 4 or FIG. 15 is generally not smaller than 10 pl. Even when the ejection amount is 1 pl, which is possible by using the superinkjet technology, the droplet of the ink 200 spreads over about 16 μm. FIG. 25A and FIG. 25B show RGB-1 pixel unit when the pixel density is 458 ppi and 1000 ppi, respectively. As shown in FIG. 25B, when the pixel density is 1000 ppi (25 μm □), it is necessary to set extent of the droplet of the ink 200 to be about 5 μm φ. For this, it is necessary to suppress the ejection amount to 0.03 pl. However, it is very difficult technologically to control the ejection amount of the ink 200 to be such an infinitesimal quantity, which will invite the increase of manufacturing cost and choking of the ejection nozzle 308. Therefore, in the seventh embodiment, described is a method of manufacturing an ultrafine pixel color micro LED display to avoid such a problem.

Figure 26A:
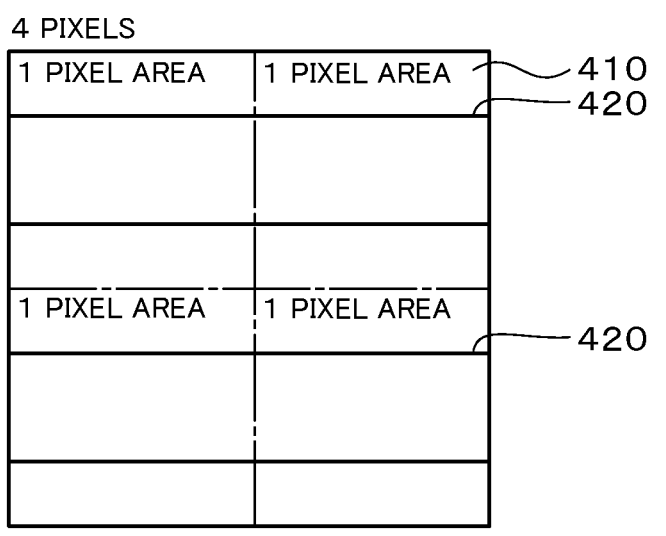
FIG. 26A A plan view showing a method of manufacturing an ultrafine pixel color micro LED display according to a seventh embodiment of the invention.
Figure 26B:
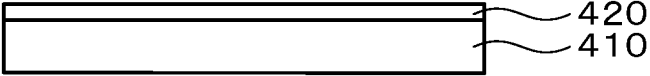
FIG. 26B A cross-sectional view showing the method of manufacturing an ultrafine pixel color micro LED display according to the seventh embodiment of the invention.

FIG. 26A and FIG. 26B show the mounting substrate 400 which is used to manufacture the ultrafine pixel color micro LED display. Here, FIG. 26B is a cross-sectional view along the lower electrode. As shown in FIG. 26A and FIG. 26B, the lower electrodes 420 are provided on one major surface of the substrate 410 parallel to each other such that they cross the pixel area. The widths of each pixel area in the longitudinal direction and the transversal direction are, for example, about 25 μm and the width of the lower electrode 420 is, for example, about 12 μm. Details of the substrate 410 and the lower electrode 420 are the same as the first embodiment. The surface of the lower electrode 420 is hydrophilic.

Figure 27A:
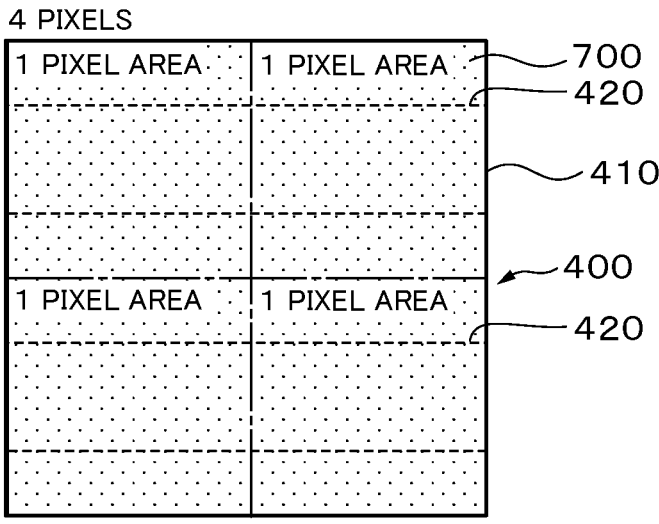
FIG. 27A A plan view showing the method of manufacturing an ultrafine pixel color micro LED display according to the seventh embodiment of the invention.
Figure 27B:
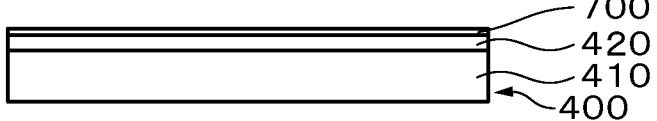
FIG. 27B A cross-sectional view showing the method of manufacturing an ultrafine pixel color micro LED display according to the seventh embodiment of the invention.

Then, as shown in FIG. 27A and FIG. 27B, a hydrophobic sensitized resist 700 is coated on the whole surface of the mounting substrate 400.

Figure 28A:
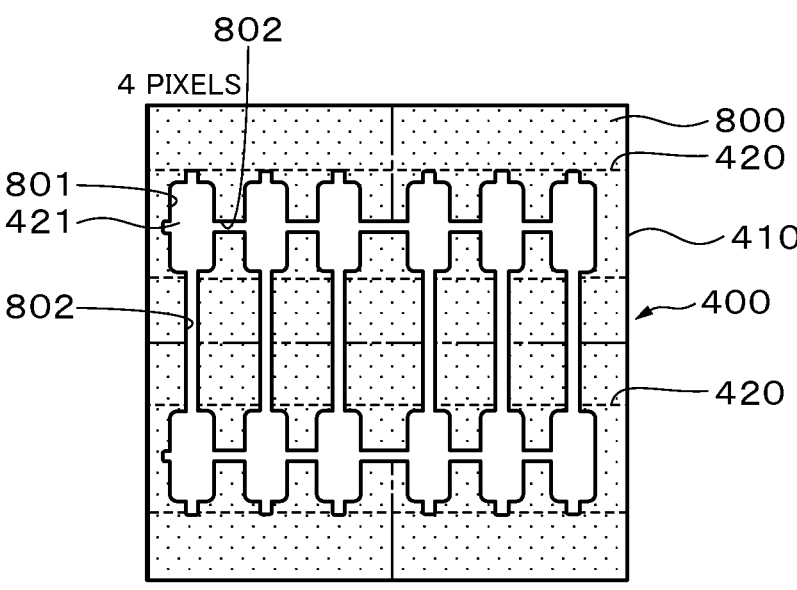
FIG. 28A A plan view showing the method of manufacturing an ultrafine pixel color micro LED display according to the seventh embodiment of the invention.
Figure 28B:
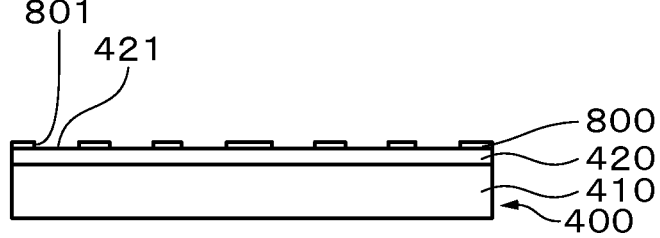
FIG. 28B A cross-sectional view showing the method of manufacturing an ultrafine pixel color micro LED display according to the seventh embodiment of the invention.

Then, as shown in FIG. 28A and FIG. 28B, formed is a hydrophobic sensitized resist pattern 800 having three openings 801 adjacent to each other in each pixel area and a connection path 802 which connects the openings 801 in one pixel and further the openings 801 in different pixel by carrying out an exposure and development of the hydrophobic sensitized resist 700 by the conventional publicly known photolithgraphic technology. In this case, the surface of the lower electrode 420 which is exposed in each opening 801 forms the chip joining part 421. Range of a group of openings 801 which are connected by the connection path 802 is designed such that the supplied ink 200 is distributed properly to each opening 801. In this way, it is possible to realize the state where the surface of the chip joining part 421 inside the opening 801 and the substrate 410 inside the connection path 802 is hydrophilic and the peripheral area of the chip joining part 421 is hydrophobic. The width of the opening 801, that is, the chip joining part 421 is, for example, about 5 μm.

Figure 29A:
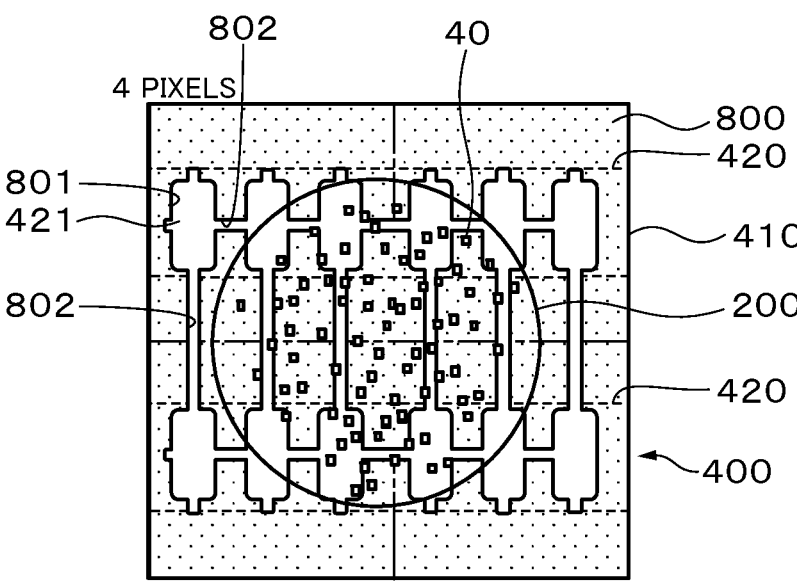
FIG. 29A A plan view showing the method of manufacturing an ultrafine pixel color micro LED display according to the seventh embodiment of the invention.
Figure 29B:
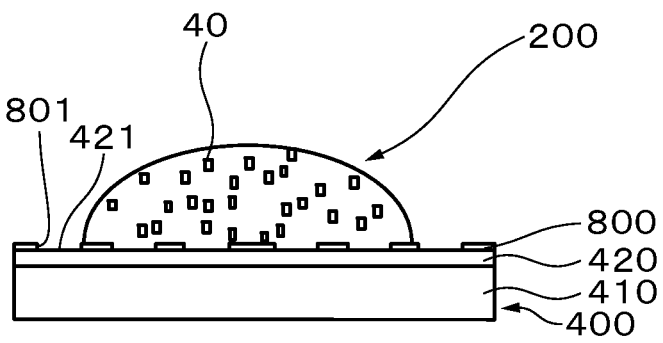
FIG. 29B A cross-sectional view showing the method of manufacturing an ultrafine pixel color micro LED display according to the seventh embodiment of the invention.

Then, as shown in FIG. 29A and FIG. 29B, the ink 200 is ejected on the mounting substrate 400 as the same as the first embodiment. In this case, since one chip joining part 421 is small, the ink 200 is ejected such that it straddles over the wide area including a group of chip joining parts 421. In FIG. 29A and FIG. 29B, shown is the state where the ink 200 is ejected such that it straddles over eight chip joining parts 421. The diameter of the ink 200 is, for example, about 35 μm and the volume of the ink 200 is, for example, about 10 pl. The ink 200 contains blue light emission or ultraviolet light emission vertical micro LED chips 40.

Figure 30A:
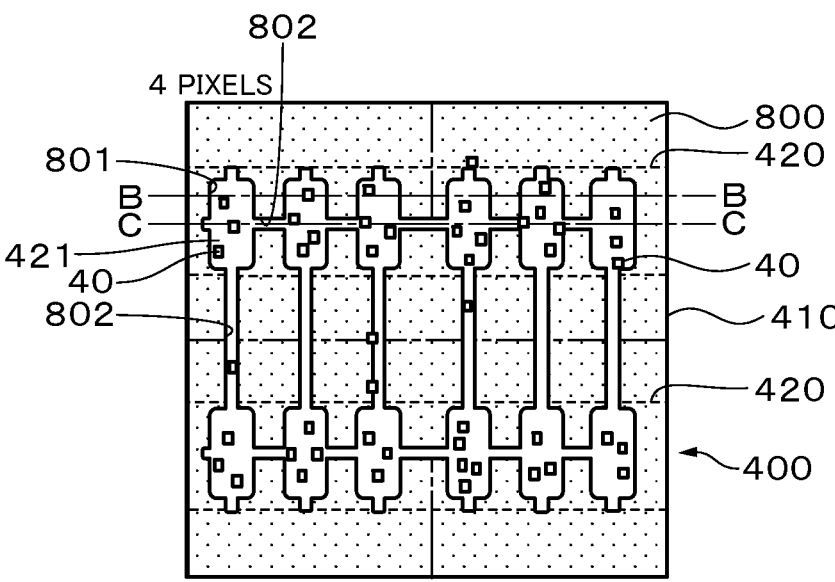
FIG. 30A A plan view showing the method of manufacturing an ultrafine pixel color micro LED display according to the seventh embodiment of the invention.
Figure 30B:
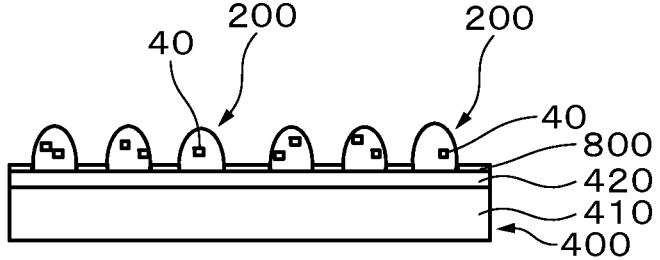
FIGS. 30B and 30C Cross-sectional views showing the method of manufacturing an ultrafine pixel color micro LED display according to the seventh embodiment of the invention.
Figure 30C:
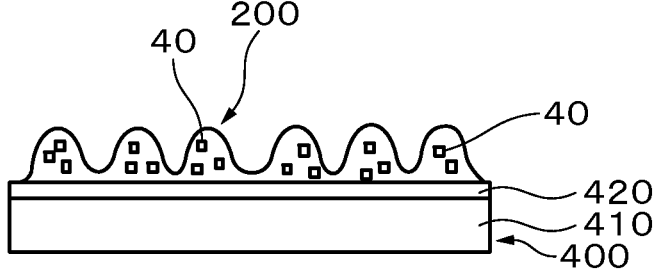

All chip joining parts 421 in FIG. 29A are connected by the connection path 802 which is hydrophilic as the same as the chip joining part 421. Therefore, when the ink 200 is ejected as shown in FIG. 29A and FIG. 29B, the ink 200 spreads out each chip joining part 421 through the connection path 802 as shown in FIG. 30A, FIG. 30B and FIG. 30C. Here, FIG. 30B is a cross-sectional view along the B-B line of FIG. 30A and FIG. 30C is a cross-sectional view along the C-C line of FIG. 30A.

Figure 31A:
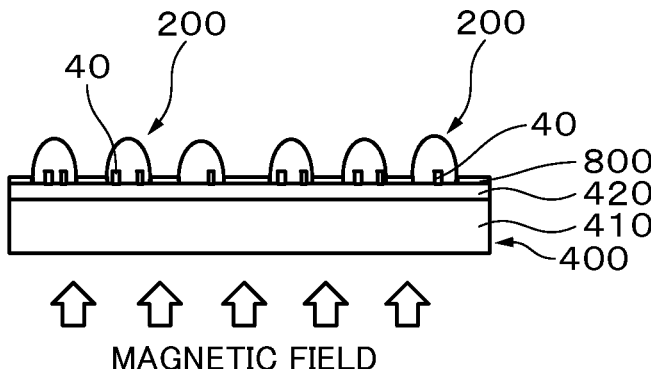
FIG. 31A A cross-sectional view showing the method of manufacturing an ultrafine pixel color micro LED display according to the seventh embodiment of the invention.
Figure 31B:
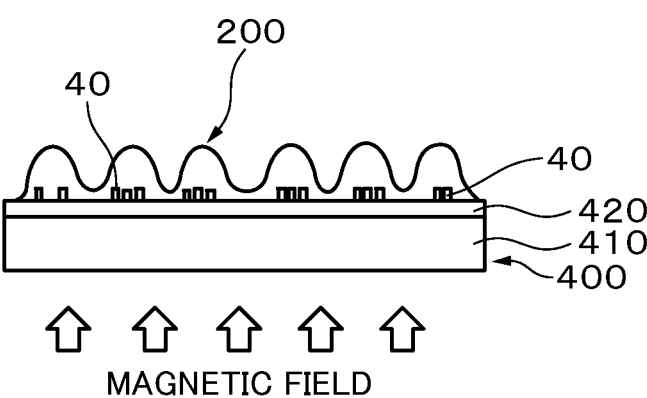
FIG. 31B A cross-sectional view showing the method of manufacturing an ultrafine pixel color micro LED display according to the seventh embodiment of the invention.

Then, as shown in FIG. 31A and FIG. 31B, the p-side electrode 17 of the vertical micro LED chip 40 is brought into contact with each chip joining part 421 of the lower electrode 420 by applying an external magnetic field as the same as the first embodiment. FIG. 31A and FIG. 31B correspond to FIG. 30B and FIG. 30C, respectively. Then, the p-side electrode 17 of the vertical micro LED chip 40 is joined electrically and mechanically to each chip joining part 421 of the lower electrode 420 as the same as the first embodiment.

Thereafter, processes are carried out as the same as the first embodiment. Finally, when the vertical micro LED chip 40 is for blue light emission, RGB light emission is realized by arranging red phosphor and green phosphor over the vertical micro LED chip 40 joined to each chip joining part 421 in the R light emission area of each pixel and the vertical micro LED chip 40 joined to each chip joining part 421 in the G light emission area, respectively, and when the vertical micro LED chip 40 is for ultraviolet light emission, RGB light emission is realized by arranging red phosphor, green phosphor and blue phosphor over the vertical micro LED chip 40 joined to each chip joining part 421 in the R light emission area of each pixel, the vertical micro LED chip 40 joined to each chip joining part 421 in the G light emission area and the vertical micro LED chip 40 joined to each chip joining part 421 in the Blight emission area, respectively, though their illustration and details are omitted. Finally, the target ultrafine pixel color micro LED display is manufactured.

According to the seventh embodiment, another advantage can be obtained in addition to the same advantages as the first embodiment. That is, when the ink 200 is ejected, the surface of the chip joining part 421 inside the opening 801 and the substrate 410 inside the connection path 802 is hydrophilic, whereas the peripheral region of the chip joining part 421 is hydrophobic. Therefore, even though the size of the chip joining part 421 is small, it is possible to spread easily the ink 200 to a group of chip joining parts 421 without decreasing the amount of the ink 200 excessively. As a result, the difficulty of manufacture of the ejection nozzle 308 is not raised and clogging of the ejection nozzle 308 can be avoided. Finally, it is possible to manufacture the ultrafine pixel color micro LED display easily and at low cost.

The Eighth Embodiment

[Method of Manufacturing an Ultrafine Pixel Color Micro LED Display]

In the seventh embodiment, the ink 200 is ejected to the chip joining part 421 by the inkjet technology. In contrast to this, in the eighth embodiment, described is a method of manufacturing an ultrafine pixel color micro LED display without using the inkjet technology.

Figure 32A:
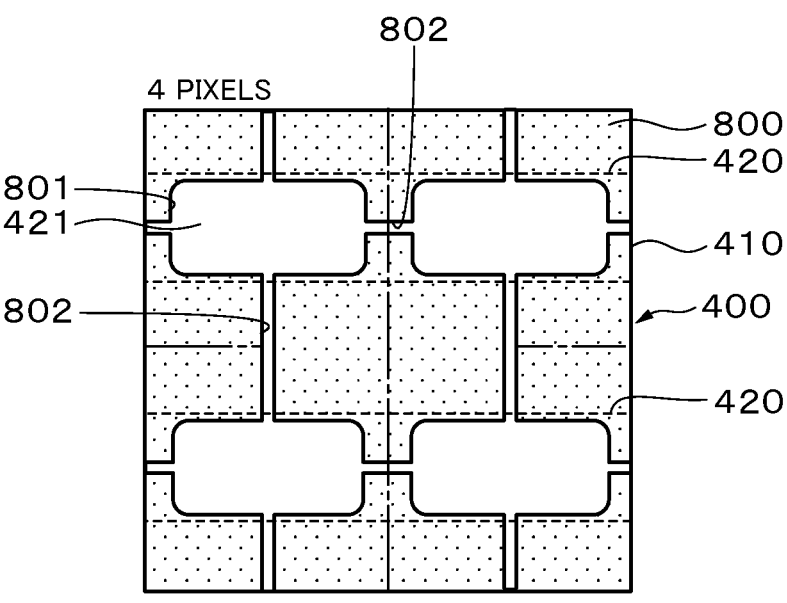
FIG. 32A A plan view showing a method of manufacturing an ultrafine pixel color micro LED display according to an eighth embodiment of the invention.
Figure 32B:
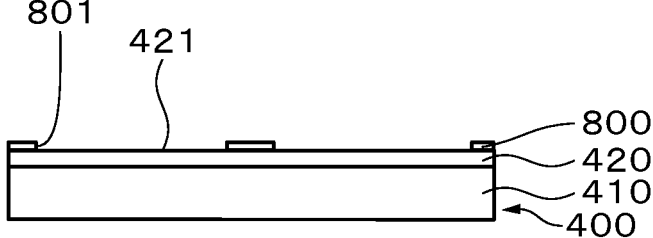
FIG. 32B A cross-sectional view showing the method of manufacturing an ultrafine pixel color micro LED display according to the eighth embodiment of the invention.

That is, first, as the same as the seventh embodiment, the hydrophobic sensitized resist 700 is coated on the whole surface of the mounting substrate 400 as shown in FIG. 27A and FIG. 27B. Thereafter, as shown in FIG. 32A and FIG. 32B, formed is the hydrophobic sensitized resist pattern 800 having rectangular openings 801 which locate in the middle of each pixel area and are long and narrow in the longitudinal direction of the upper electrode 420 and the connection path 802 which connects the openings 801 in different pixel each other by carrying out an exposure and development of the hydrophobic sensitized resist 700 by the conventional publicly known photolithgraphic technology. The shape of the opening 801 may be shapes other than rectangular shape. Although the connection path 802 can be omitted, when the hydrophilic areas are connected by the connection path 802, it is easy to equalize the amount of the liquid 50 which accumulates in each opening 801, which will be described later.

Figure 33:
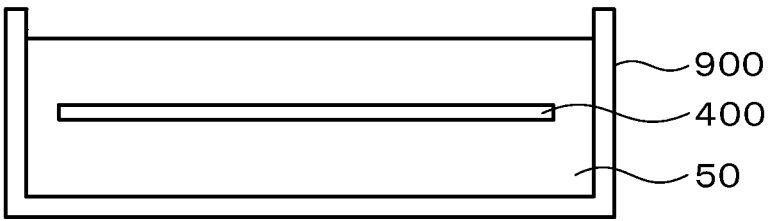
FIG. 33 A schematic view showing the method of manufacturing an ultrafine pixel color micro LED display according to the eighth embodiment of the invention.
Figure 34:
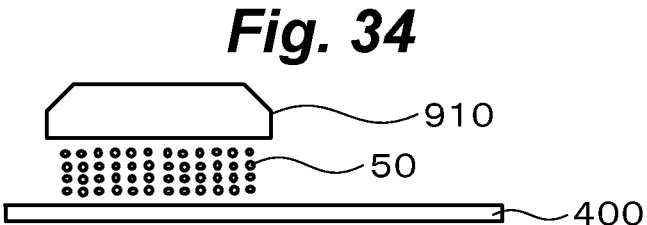
FIG. 34 A schematic view showing the method of manufacturing an ultrafine pixel color micro LED display according to the eighth embodiment of the invention.
Figure 35A:
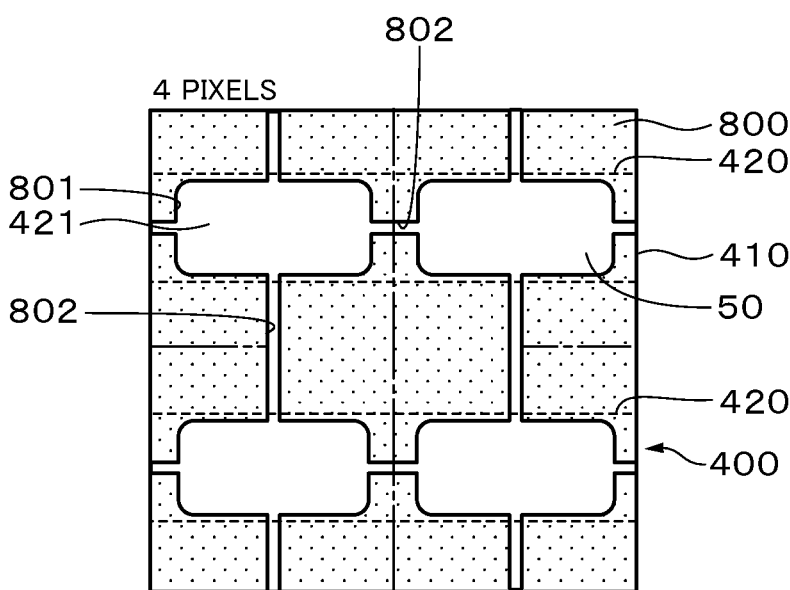
FIG. 35A A plan view showing the method of manufacturing an ultrafine pixel color micro LED display according to the eighth embodiment of the invention.
Figure 35B:
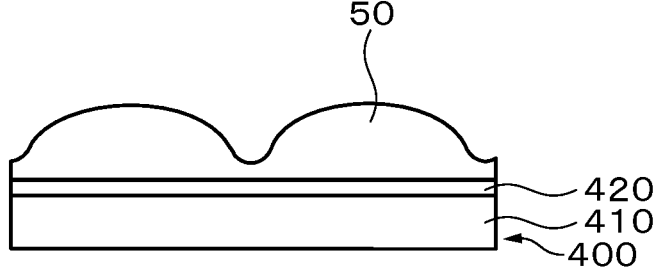
FIG. 35B A cross-sectional view showing the method of manufacturing an ultrafine pixel color micro LED display according to the eighth embodiment of the invention.

Then, as shown in FIG. 33, the mounting substrate 400 on which the hydrophobic sensitized resist pattern 800 is formed is dipped in the liquid 50 stored in a container 900 such as water and the like. Alternatively, as shown in FIG. 34, the liquid 50 such as water and the like is showered by a shower device 910 to the surface of the mounting substrate 400 from the upper side in the form of a liquid droplet. FIG. 35A and FIG. 35B show the mounting substrate 400 after it is taken out from the liquid 50 in the container 900 or after the liquid 50 is showered to the surface of the mounting substrate 400 in the form of a liquid droplet. As shown in FIG. 35A and FIG. 35B, the liquid 50 avoids the hydrophobic sensitized resist pattern 800 and coheres on the chip joining part 421 inside the opening 801 and the substrate 410 inside the connection path 802. Especially, the liquid 50 coheres on the chip joining part 421 like a liquid droplet.

Figure 36:
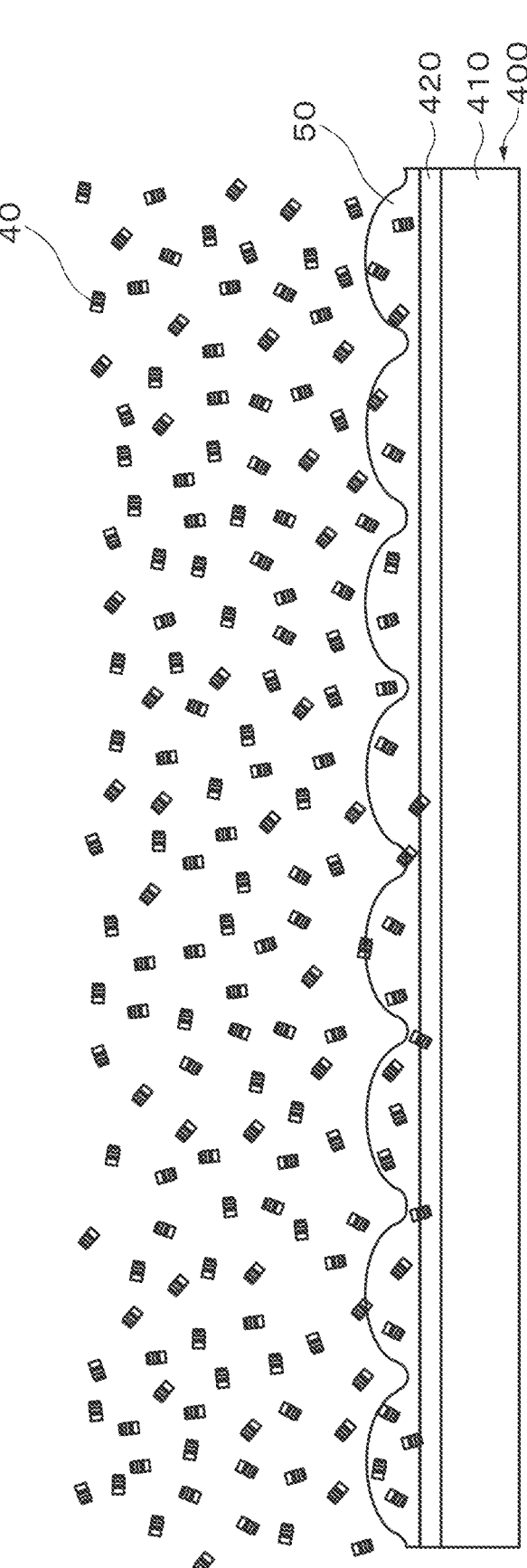
FIG. 36 A schematic view showing the method of manufacturing an ultrafine pixel color micro LED display according to the eighth embodiment of the invention.
Figures 37A, 37B:
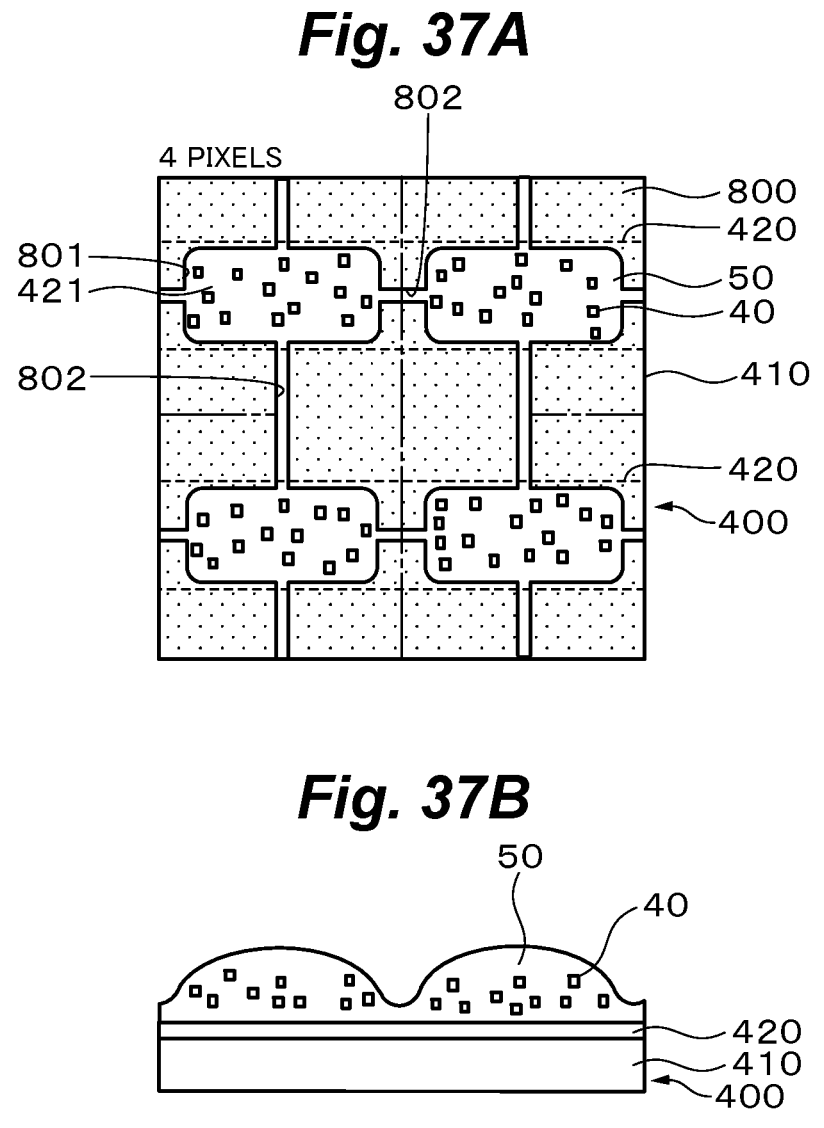

Then, as shown in FIG. 36, the mounting substrate 400 shown in FIG. 35A and FIG. 35B is placed in the space in which the vertical micro LED chips 40 are dispersed in a gas such as air and the like. A part of the vertical micro LED chips 40 dispersed in this way are captured by the droplet-like liquid 50 in each opening 801 of the mounting substrate 400. The average number of the vertical micro LED chips 40 which are captured by the droplet-like liquid 50 in each opening 801 of the hydrophobic sensitized resist pattern 800 is adjusted by the number density of the dispersed micro LED chips 40, the exposition time of the mounting substrate 400 and the like. As necessary, as measures against electrostatic breakdown, micro LED chips or Zener diodes having reverse polarization to the vertical micro LED chips 40 are mixed with the vertical micro LED chips 40 in a ratio of, for example, 0.1%~1% and dispersed in the gas so as to be captured by the droplet-like liquid 50 in each opening 801. In this way, as shown in FIG. 37A and FIG. 37B, the vertical micro LED chips 40 or further the micro LED chips or Zener diodes having reverse polarization to the vertical micro LED chips 40 are captured by the liquid 50 inside each opening 801.

Then, as shown in FIG. 38, the p-side electrode 17 of the vertical micro LED chip 40 is brought into contact with each chip joining part 421 of the lower electrode 420 by applying an external magnetic field as the same as the first embodiment. Then, the p-side electrode 17 of the vertical micro LED chip 40 is connected electrically and mechanically with each chip joining part 421 of the lower electrode 420 as the same as the first embodiment.

Thereafter, processes are carried out as the same as the seventh embodiment to manufacture the target ultrafine pixel color micro LED display.

According to the eighth embodiment, almost the same advantages as the seventh embodiment can be obtained. Further, it is possible to manufacture the ultrafine pixel color micro LED display easily and at low cost without using the inkjet technology.

The Ninth Embodiment

[Method of Manufacturing an Ultrafine Pixel Color Micro LED Display]

In the ninth embodiment, described is a method of manufacturing an ultrafine pixel color micro LED display without using the inkjet technology as the same as the eighth embodiment.

That is, as shown in FIG. 32A and FIG. 32B, firstly the hydrophobic sensitized resist pattern 800 is formed on the mounting substrate 400 as the same as the eighth embodiment. Then, as shown in FIG. 39, the ink 200 in which the vertical micro LED chips 40 are dispersed in the liquid 50 such as water and the like is put in the container 900 and the mounting substrate 400 on which the hydrophobic sensitized resist pattern 800 is formed is dipped into the ink 200. As necessary, as measures against electrostatic breakdown, micro LED chips or Zener diodes having reverse polarization to the vertical micro LED chips 40 are mixed with the vertical micro LED chips 40 in a ratio of, for example, 0.1% 1% and dispersed in the gas. Alternatively, as shown in FIG. 40, the ink 200 is showered by the shower device 910 to the surface of the mounting substrate 400 from the upper side in the form of a liquid droplet. The mounting substrate 400 after taken out from the ink 200 in the container 900 or after showered by the ink 200 in the form of a liquid droplet is as shown in FIG. 37A and FIG. 37B.

Then, as shown in FIG. 38, the p-side electrode 17 of the vertical micro LED chip 40 is brought into contact with each chip joining part 421 of the lower electrode 420 by applying an external magnetic field as the same as the first embodiment. Then, the p-side electrode 17 of the vertical micro LED chip 40 is connected electrically and mechanically with each chip joining part 421 of the lower electrode 420 as the same as the first embodiment.

Thereafter, processes are carried out as the same as the seventh embodiment to manufacture the target ultrafine pixel color micro LED display.

According to the ninth embodiment, the same advantages as the eighth embodiment can be obtained.

Heretofore, embodiments of the present invention have been explained specifically. However, the present invention is not limited to these embodiments, but contemplates various changes and modifications based on the technical idea of the present invention.

For example, numerical numbers, structures, shapes, materials, methods and the like presented in the aforementioned embodiments are only examples, and the different numerical numbers, structures, shapes, materials, methods and the like may be used as necessary.

For example, in the fourth embodiment, the ink in which the blue light emission vertical micro LED chips 510 are dispersed, the ink in which the red light emission vertical micro LED chips 520 are dispersed and the ink in which the green light emission vertical micro LED chips 530 are dispersed are ejected at the same time from three ejection nozzles. However, each of these inks may be ejected independently.

Although not illustrated as embodiments, RGB light emission may be realized by dispersing, for example, the blue light emission vertical micro LED chips 510 on all of three chip joining parts 421A, 421B, 421C and coating red phosphor and green phosphor over the chip joining parts 421B, 421C, respectively after formation of the upper electrode, test and repair. RGB light emission may also be realized by joining, for example, a plurality of near ultraviolet light emission vertical micro LED chips to all of the chip joining parts 421A, 421B, 421C in random arrangement and applying blue phosphor, red phosphor and green phosphor over the chip joining parts 421A, 421B, 421C, respectively after formation of the upper electrode, test and repair. Furthermore, RGB light emission may be realized by joining the blue light emission vertical micro LED chips 510 to the chip joining parts 421A, 421B in random arrangement and a plurality of green light emission vertical micro LED chips 530 to the chip joining part 421C in random arrangement and applying red phosphor over the chip joining part 421B after formation of the upper electrode, test and repair.

EXPLANATION OF REFERENCE NUMERALS

12 n⁺-type GaN layer
13 light emitting layer
14 p-type GaN layer
16 Sn film
17 p-side electrode
21 n-side electrode
40 vertical micro LED chip
200 ink
300 ink ejection device
311~313 magnetic field applying device
400 mounting substrate
410 substrate
420 lower electrode

421 chip joining part
430 upper electrode
431 upper electrode main line part
432 upper electrode branch line part
433 thin film fuse
4204 thin film fuse
4201, 4202 lower electrode main line part
4203 lower electrode branch line part

The invention claimed is:

1. A semiconductor light emitting element chip integrated device, comprising:

a substrate having a lower electrode on one major surface, a chip joining part on which semiconductor light emitting element chips are to be joined which is formed by a part of an upper surface or a protrusion or a concavity formed on a part of an upper surface of the lower electrode, a plurality of vertical semiconductor light emitting element chips joined to the chip joining part, each of which has a p-side electrode and an n-side electrode on an upper surface and a lower surface of the semiconductor light emitting element chip, respectively and is configured such that one of the p-side electrode or the n-side electrode is more strongly attracted to a magnetic field than the other; and an upper electrode as an upper layer of the semiconductor light emitting element chips having a main line part and a plurality of branch line parts which are connected to each other by a thin film fuse, the semiconductor light emitting element chips being joined to the chip joining part such that the one of the p-side electrode or the n-side electrode faces the chip joining part, the one of the p-side electrode or the n-side electrode and the lower electrode being electrically connected to each other, and the other of the p-side electrode or the n-side electrode of at least one semiconductor light emitting element chip the branch line parts of the upper electrode being electrically connected to each other.

2. The semiconductor light emitting element chip integrated device according to claim 1 wherein the upper electrode and the lower electrode are formed for respective circuit units.

3. The semiconductor light emitting element chip integrated device according to claim 1 wherein one pixel is formed by an area including more than 3 circuit units adjacent to each other.

4. The semiconductor light emitting element chip integrated device according to claim 1 wherein the one of the p-side electrode or the n-side electrode contains soft magnetic materials.

5. The semiconductor light emitting element chip integrated device according to claim 1 wherein the semiconductor light emitting element chip has the chip size not larger than 10 μm×10 μm and the thickness not larger than 10 μm.

6. The semiconductor light emitting element chip integrated device according to claim 1 wherein the chip joining part is formed such that hydrophilic property or lipophilic property of the chip joining part is higher than that of a peripheral part of the chip joining part.

7. The semiconductor light emitting element chip integrated device according to claim 6 wherein a predetermined group of chip joining parts which are adjacent to each other are mutually connected by an area which is formed to have the high hydrophilic property or lipophilic property similar to the chip joining part.

8. A semiconductor light emitting element chip integrated device, comprising:

a substrate having a lower electrode having a main line part and a plurality of branch line parts which are connected to each other by a thin film fuse on one major surface, a chip joining part which is formed by an upper surface of the branch line part of the lower electrode, to which semiconductor light emitting element chips are to be joined, a plurality of vertical semiconductor light emitting element chips joined to the chip joining part, each of which has a p-side electrode and an n-side electrode on an upper surface and a lower surface of the semiconductor light emitting element chip, respectively and is configured such that one of the p-side electrode or the n-side electrode is more strongly attracted to a magnetic field than the other; and an upper electrode as an upper layer of the semiconductor light emitting element, the semiconductor light emitting element chips being joined to the chip joining part such that the one of the p-side electrode or the n-side electrode faces the chip joining part, the one of the p-side electrode or the n-side electrode and the branch line part of the lower electrode being electrically connected to each other, and the other of the p-side electrode or the n-side electrode of at least one semiconductor light emitting element chip and the upper electrode being electrically connected to each other.

9. The semiconductor light emitting element chip integrated device according to claim 8 wherein the upper electrode and the lower electrode are formed for respective circuit units.

10. The semiconductor light emitting element chip integrated device according to claim 8 wherein one pixel is formed by an area including more than 3 circuit units adjacent to each other.

11. The semiconductor light emitting element chip integrated device according to claim 8 wherein the one of the p-side electrode or the n-side electrode contains soft magnetic materials.

12. The semiconductor light emitting element chip integrated device according to claim 8 wherein the semiconductor light emitting element chip has the chip size not larger than 10 μm×10 μm and the thickness not larger than 10 μm.

13. The semiconductor light emitting element chip integrated device according to claim 8 wherein the chip joining part is formed such that hydrophilic property or lipophilic property of the chip joining part is higher than that of a peripheral part of the chip joining part.

14. The semiconductor light emitting element chip integrated device according to claim 13 wherein a predetermined group of chip joining parts which are adjacent to each other are mutually connected by an area which is formed to have the high hydrophilic property or lipophilic property similar to the chip joining part.

15. A method of manufacturing a semiconductor light emitting element chip integrated device, comprising steps of:

supplying a liquid-droplet-like ink containing a liquid and a plurality of vertical semiconductor light emitting element chips, each of which has a p-side electrode and an n-side electrode on an upper surface and a lower surface of the semiconductor light emitting element chip, respectively and is configured such that one of the p-side electrode or the n-side electrode is more strongly attracted to a magnetic field than the other of the p-side electrode or the n-side electrode to a chip joining part formed by a part of an upper surface or a protrusion or a concavity formed on a part of an upper surface of a lower electrode on a substrate having the lower electrode on one major surface, to which semiconductor light emitting element chips are to be joined, joining the semiconductor light emitting element chips to the chip joining part by applying an external magnetic field from the opposite side with respect to the substrate such that the one of the p-side electrode or the n-side electrode faces the chip joining part and electrically connecting the one of the p-side electrode or the n-side electrode and the lower electrode; and forming an upper electrode as an upper layer of the semiconductor light emitting device chips having a main line part and a plurality of branch line parts which are electrically connected to each other by a thin film fuse such that the other of the p-side electrode or the n-side electrode of at least one semiconductor light emitting element chip and the branch line part of the upper electrode are electrically connected to each other.

16. The method of manufacturing a semiconductor light emitting element chip integrated device according to claim 15 further comprising a step of testing the semiconductor light emitting element chip after the upper electrode is formed and cutting the thin film fuse between the branch line part to which the defective semiconductor light emitting element chip is connected and the main line part.

17. The method of manufacturing a semiconductor light emitting element chip integrated device according to claim 15 wherein the ink is ejected from the tip of a nozzle to the chip joining part by an inkjet printing method.

18. A method of manufacturing a semiconductor light emitting element chip integrated device, comprising steps of:

supplying a liquid-droplet-like ink containing a liquid and a plurality of vertical semiconductor light emitting element chips, each of which has a p-side electrode and an n-side electrode on an upper surface and a lower surface of the semiconductor light emitting element chip, respectively and is configured such that one of the p-side electrode or the n-side electrode is more strongly attracted to a magnetic field than the other of the p-side electrode or the n-side electrode to a chip joining part formed by an upper surface of branch line parts of a lower electrode on a substrate having a main line part and a plurality of branch line parts which are electrically connected to each other by a thin film fuse on one major surface, to which semiconductor light emitting element chips are to be joined, joining the semiconductor light emitting element chips in the ink to the chip joining part by applying an external magnetic field from the opposite side with respect to the substrate such that the one of the p-side electrode or the n-side electrode faces the chip joining part and electrically connecting the one of the p-side electrode or the n-side electrode and the branch line parts of the lower electrode; and forming an upper electrode as an upper layer of the semiconductor light emitting element chips such that the other of the p-side electrode or the n-side electrode of at least one semiconductor light emitting element chip and the upper electrode are electrically connected to each other.

19. The method of manufacturing a semiconductor light emitting element chip integrated device according to claim 18 further comprising a step of testing the semiconductor light emitting element chip after the upper electrode is formed and cutting the thin film fuse between the branch line part to which the defective semiconductor light emitting element chip is connected and the main line part.

20. The method of manufacturing a semiconductor light emitting element chip integrated device according to claim 18 wherein the ink is ejected from the tip of a nozzle to the chip joining part by an inkjet printing method.

* * * * *